(12) United States Patent
Islam et al.

(10) Patent No.: US 7,709,935 B2
(45) Date of Patent: May 4, 2010

(54) REVERSIBLE LEADLESS PACKAGE AND METHODS OF MAKING AND USING SAME

(75) Inventors: Shafidul Islam, Plano, TX (US); Romarico S. San Antonio, Batam Island (ID)

(73) Assignee: Unisem (Mauritius) Holdings Limited, Port Louis (MU)

( * ) Notice: Subject to any disclaimer, the term of this patent is extended or adjusted under 35 U.S.C. 154(b) by 750 days.

(21) Appl. No.: 10/563,906

(22) PCT Filed: Aug. 18, 2004

(86) PCT No.: PCT/US2004/026790

§ 371 (c)(1),
(2), (4) Date: Nov. 20, 2006

(87) PCT Pub. No.: WO2005/022591

PCT Pub. Date: Mar. 10, 2005

(65) Prior Publication Data

US 2007/0111374 A1 May 17, 2007

Related U.S. Application Data

(60) Provisional application No. 60/497,829, filed on Aug. 26, 2003.

(51) Int. Cl.
*H01L 23/495* (2006.01)
*H01L 23/28* (2006.01)
(52) U.S. Cl. .............. 257/666; 257/787; 257/E23.048; 257/784
(58) Field of Classification Search ................ 257/666, 257/686, E23.048, 784, 787
See application file for complete search history.

(56) References Cited

U.S. PATENT DOCUMENTS

| 5,608,262 | A | 3/1997 | Degani et al. |
| 6,201,292 | B1 * | 3/2001 | Yagi et al. .................... 257/666 |
| 6,223,429 | B1 | 5/2001 | Kaneda et al. |
| 6,281,047 | B1 * | 8/2001 | Wu et al. .................... 438/113 |
| 6,337,510 | B1 | 1/2002 | Chun-Jen et al. |
| 6,483,180 | B1 * | 11/2002 | Bayan et al. ................. 257/684 |
| 6,498,099 | B1 | 12/2002 | McLellan et al. |

(Continued)

FOREIGN PATENT DOCUMENTS

| JP | 11-307675 | 11/1999 |
| JP | 2000124240 | 4/2000 |
| JP | 2001203301 | 7/2001 |
| JP | 2003249604 | 9/2003 |
| WO | WO 02/101812 | 12/2002 |

*Primary Examiner*—Nitin Parekh
(74) *Attorney, Agent, or Firm*—Wiggin and Dana LLP

(57) ABSTRACT

A semiconductor device package includes an electrically conductive lead frame having a plurality of posts disposed at a perimeter of the package. Each of the posts has a first contact surface disposed at the first package face and a second contact surface disposed at the second package face. The lead frame also includes a plurality of post extensions disposed at the second package face. Each of the post extensions includes a bond site formed on a surface of the post extension opposite the second package face. At least one I/O pad on the semiconductor device is electrically connected to the post extension at the bond site using wirebonding, tape automated bonding, or flip-chip methods. The package can be assembled using a lead frame having pre-formed leads, with or without taping, or using partially etched lead frames. A stack of the semiconductor device packages may be formed.

12 Claims, 22 Drawing Sheets

U.S. PATENT DOCUMENTS

| | | | |
|---|---|---|---|
| 6,723,585 B1 * | 4/2004 | Tu et al. ................. 438/123 |
| 6,812,552 B2 | 11/2004 | Islam et al. |
| 7,381,588 B1 * | 6/2008 | Patel et al. ............. 438/109 |
| 2002/0027273 A1 | 3/2002 | Huang |
| 2003/0038359 A1 | 2/2003 | Fujimoto et al. |
| 2003/0042581 A1 | 3/2003 | Fee et al. |

* cited by examiner

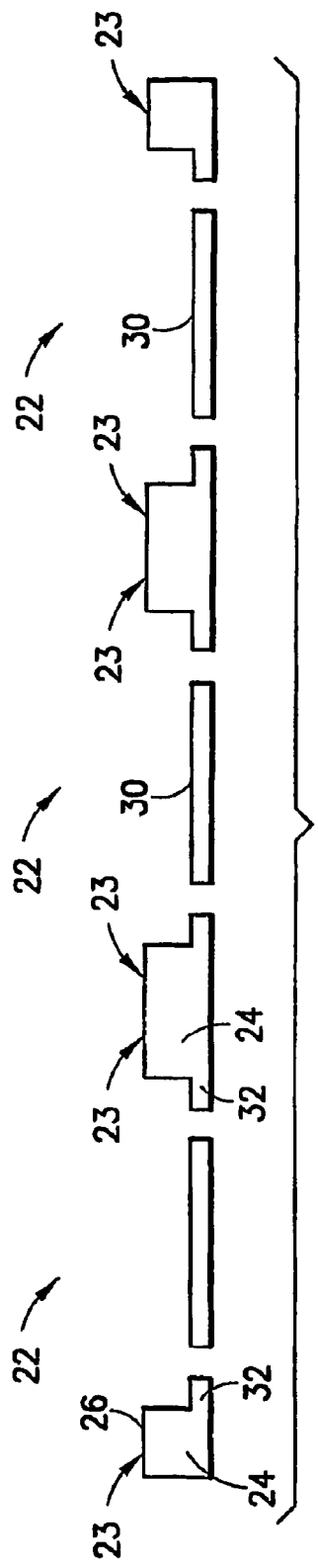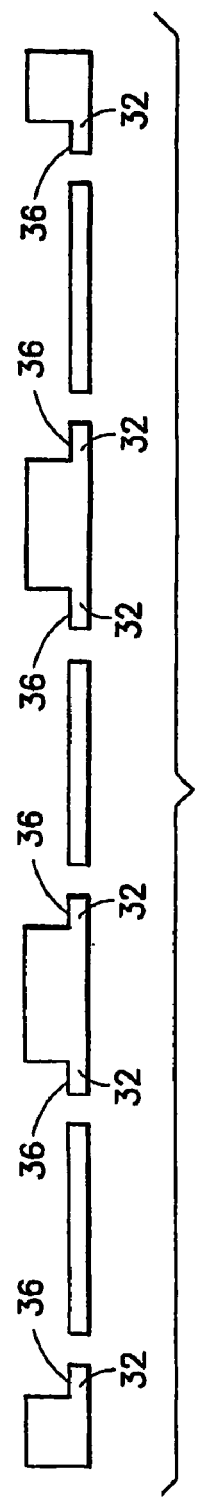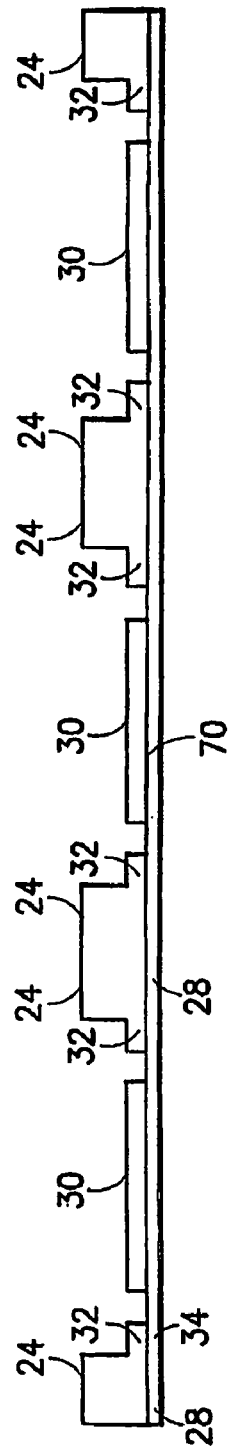

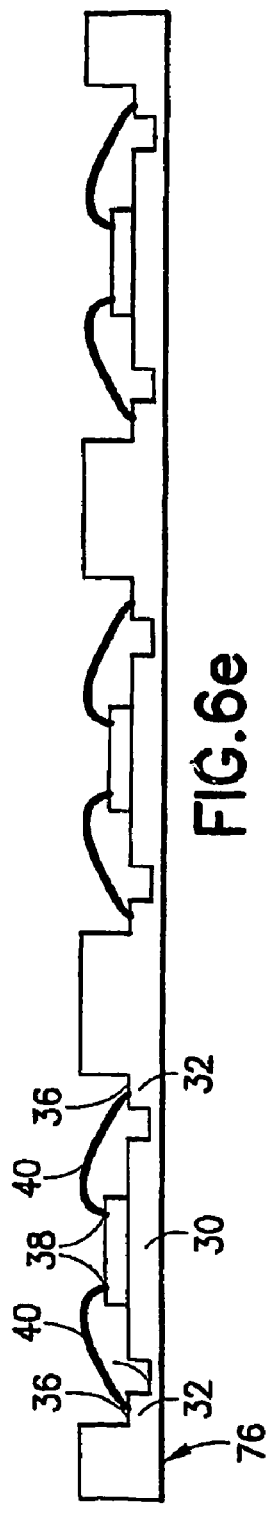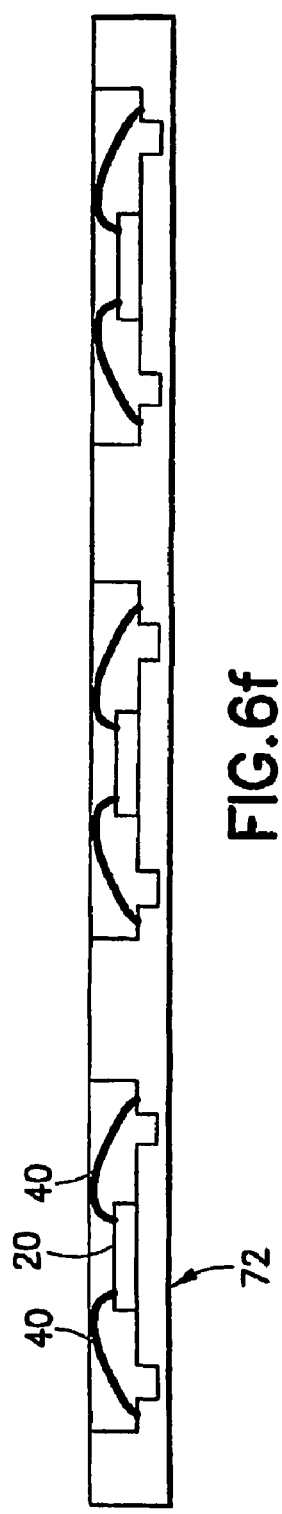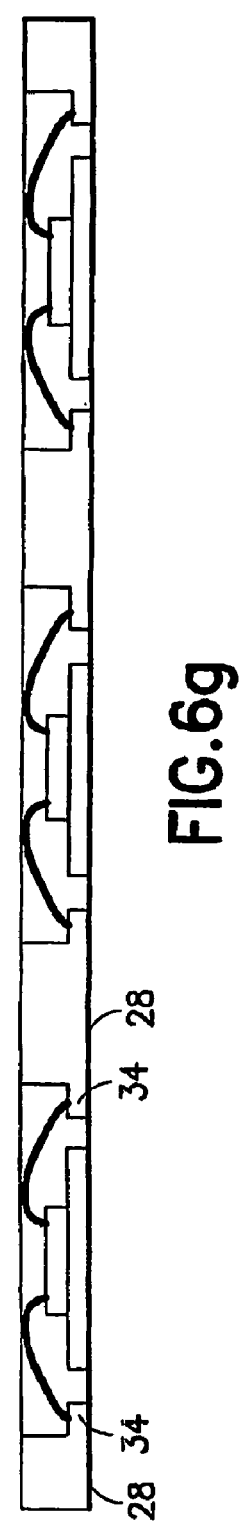

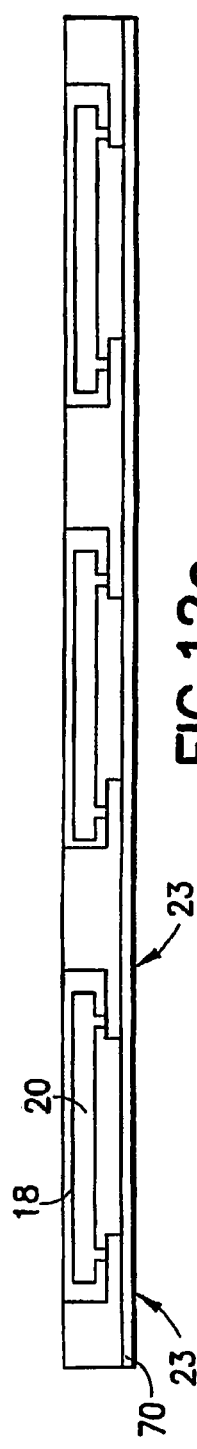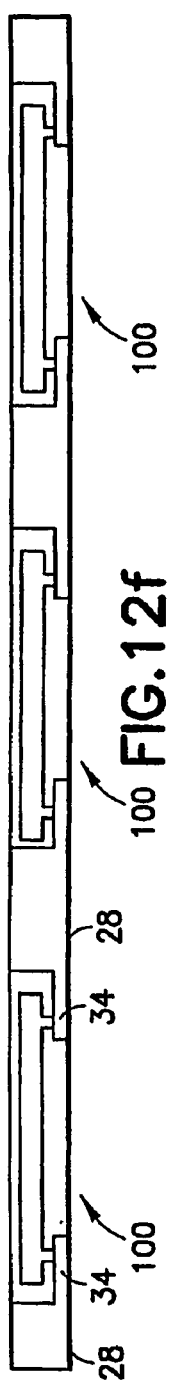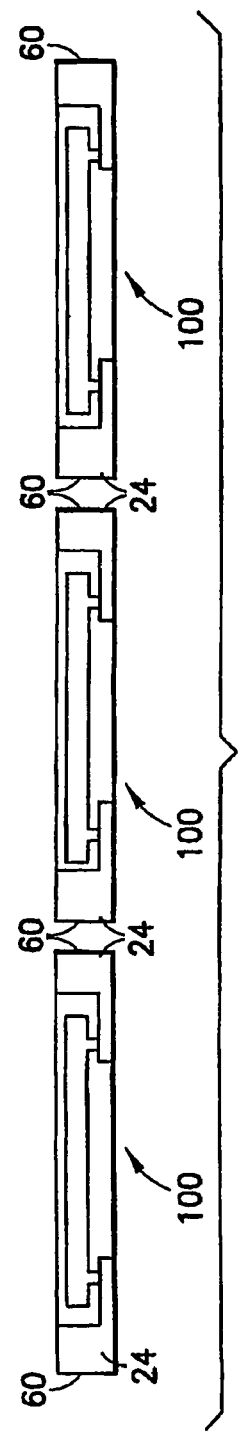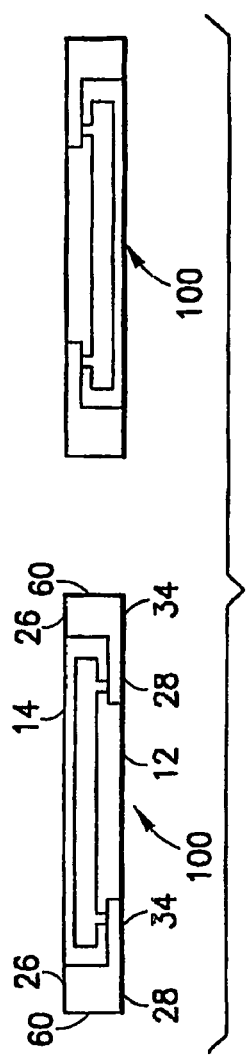

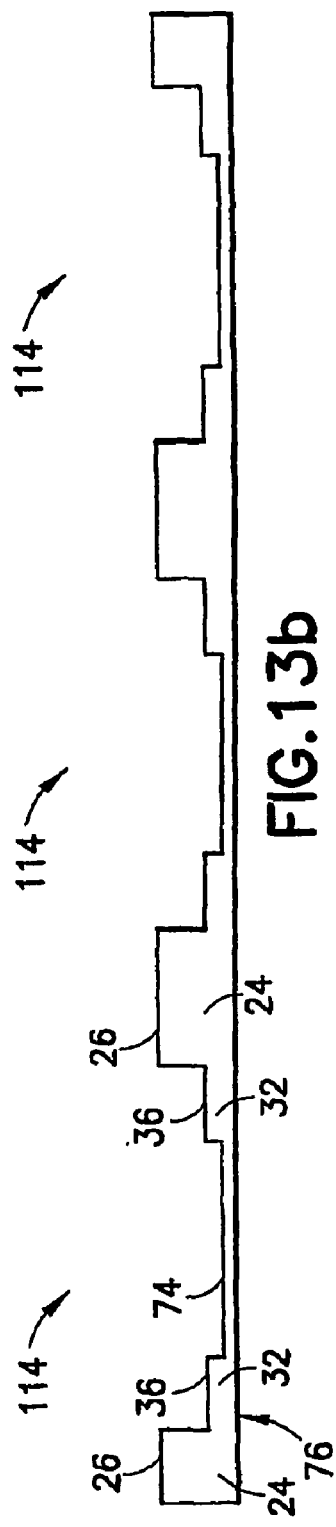
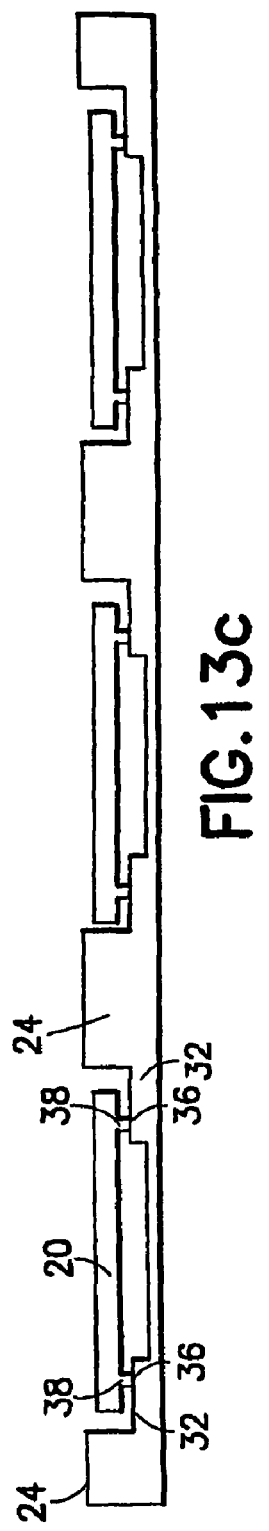
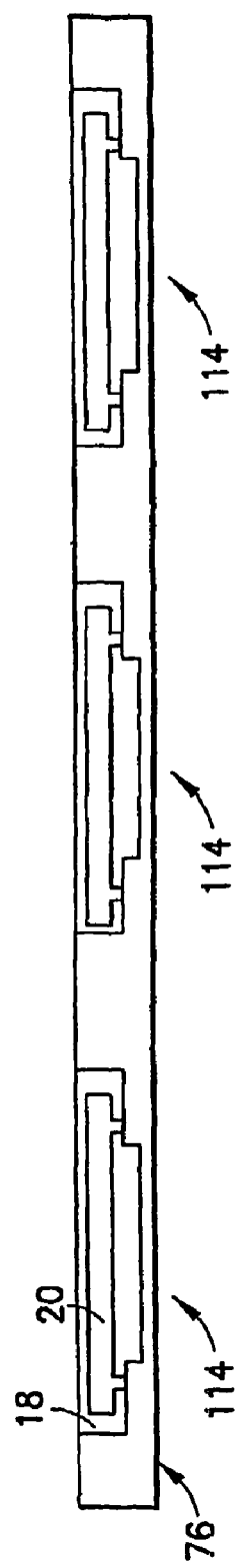
FIG.13b
FIG.13c
FIG.13d

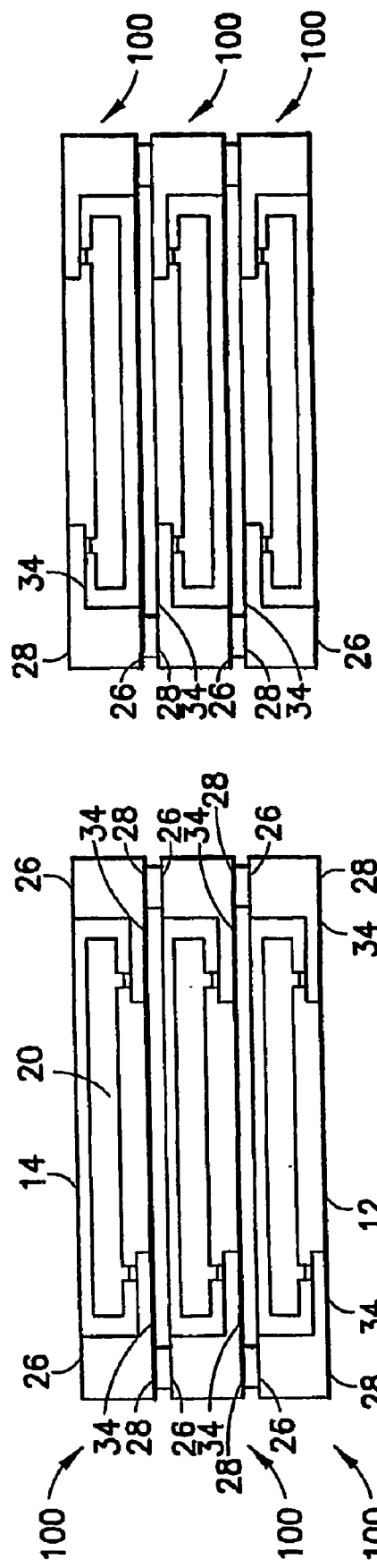
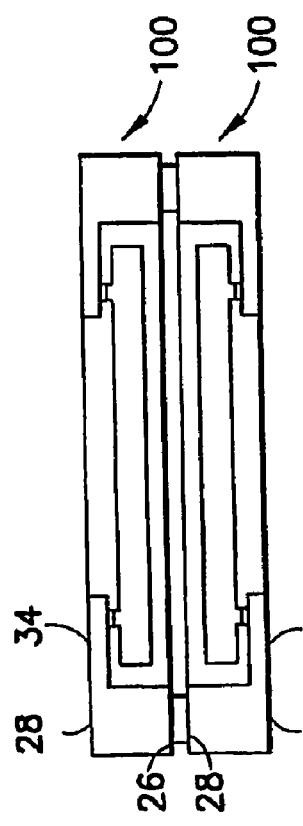

REVERSIBLE LEADLESS PACKAGE AND METHODS OF MAKING AND USING SAME

CROSS-REFERENCE TO RELATED APPLICATIONS

This application claims the benefit of U.S. Provisional Patent Application No. 60/497,829, filed Aug. 26, 2003, which is incorporated by reference herein in its entirety.

BACKGROUND OF THE INVENTION

1. Field of the Invention

This invention relates to semiconductor device packages. More particularly, this invention relates to reversible leadless semiconductor device packages and methods for manufacturing reversible leadless semiconductor device packages.

2. Description of the Related Art

In lead frame based semiconductor device packages, electrical signals are transmitted between at least one semiconductor device (die) and external circuitry, such as a printed circuit board, by an electrically conductive lead frame. The lead frame includes a plurality of leads, each having an inner lead end and an opposing outer lead end. The inner lead end is electrically connected to an input/output (I/O) pad on the die, and the outer lead end provides a terminal for connecting to the external circuitry. Where the outer lead ends terminate at a face of the package body, the package is known as a "no-lead" or "leadless" package. If the outer lead ends extend beyond the package body perimeter, the package is referred to as "leaded." Examples of well-known no-lead packages include quad flat no-lead (QFN) packages, which have four sets of leads disposed around the perimeter of the bottom of a square package body, and dual flat no-lead (DFN) packages, which have two sets of leads disposed along opposite sides of the bottom of a package body.

A method for manufacturing a lead frame for a Quad Flat No-lead ("QFN") package is disclosed in U.S. Pat. No. 6,498,099 to McLellan et al., which is incorporated by reference in its entirety herein. In the McLellan et al. patent, a first side of an electrically conductive substrate is partially etched to define a support pad and inner lead ends. A semiconductor device is bonded to the partially defined support pad and electrically interconnected to the partially defined inner lead ends by wire bonds or the like. The semiconductor device, partially defined support pad, partially defined inner leads and wire bonds are then encapsulated in a polymer molding resin. The opposing second side of the electrically conductive substrate is then etched to electrically isolate the support pad and inner lead ends and to define outer lead ends.

Another method for the manufacture of a QFN package is disclosed in commonly owned U.S. patent application Ser. No. 10/134,882 that was filed on Apr. 29, 2002 and is incorporated by reference in its entirety herein.

There is a desire in the semiconductor packaging industry to minimize the profile height (thickness) of semiconductor packages to facilitate advances in mobile, wireless, and medical applications. Current demands are for packages having profile heights in the sub-millimeter level. A need for increased processing power and speed has also created a demand to increase the number of dies that can be fit into a given area (i.e., to increase die density) and to decrease the length of the electrical path between dies.

One solution to the demands for increased die density and decreased electrical path length is to stack a number of dies inside a single package. The dies are separated by insulating layers/interposers with wire-bond and/or flip-chip die connections used to electrically connect the dies to a common lead frame. This solution, however, has its drawbacks. First, a package with stacked dies introduces complexity in the assembly of the package due at least in part to the increased number of electrical connections within the package and the need for an insulative layer/interposer to be disposed between the dies. If any defects occur during the assembly of the package, the entire package, including all chips within the stack, is unsalvageable. Second, where a wirebonding process is used to electrically connect the stacked dies, the top die in the stack must be sized to provide sufficient peripheral space on the bottom die to allow for wirebonding the bottom die. In other words, the top die must be smaller than the bottom die. Finally, stacking two or more dies in a single package increases the thickness of the encapsulated package and creates issues for power management and thermal drain.

Thus there remains a need for semiconductor device packages having a decreased profile while allowing for an increased die density and a decreased length of the electrical path between dies.

BRIEF SUMMARY OF THE INVENTION

The above-described and other needs are met by a semiconductor device package including a molding compound forming a portion of: a first package face, a second package face opposite the first package face, and package side faces extending between the first and second package faces. A semiconductor device and an electrically conductive lead frame are at least partially covered by the molding compound. The electrically conductive lead frame includes a plurality of posts disposed at a perimeter of the package and having a first contact surface disposed at the first package face and a second contact surface disposed at the second package face. The semiconductor device is positioned in the center of the plurality of posts. The lead frame also includes a plurality of post extensions each having a third contact surface disposed at the second package face. The plurality of post extensions extend from the plurality of posts toward the semiconductor device. Each of the post extensions include a bond site formed on a surface of the post extension opposite the second package face. At least one I/O pad on the semiconductor device is electrically connected to the post extension at the bond site.

In one embodiment, at least one of the I/O pads is wire bonded or tape bonded to the bond site. In another embodiment, at least one of the I/O pads is directly electrically connected to the bond site for forming a flip-chip type connection. The semiconductor device package may have four package side faces, with the plurality of leads being disposed among two of the four package side faces. Alternatively, the semiconductor device package may have four package side faces, with the plurality of leads being disposed among all of the four package side faces. In another embodiment, a stack of semiconductor device packages is formed.

In another aspect, a method for use in manufacturing a semiconductor device package comprises: (a) forming a plurality of posts from an electrically conductive material, the plurality of posts having a height equal to a predetermined profile height of the semiconductor device package, and each post in the plurality of posts having a side surface positioned at a predetermined package side face; (b) disposing a semiconductor device within a central region defined by the plurality of posts, the semiconductor device including a plurality of I/O pads disposed thereon; (c) electrically connecting the plurality of I/O pads to associated electrically conductive post extensions protruding from the plurality of posts; and (d)

covering at least a portion of the die, the plurality of posts, and post extensions with a molding compound.

Electrically connecting the I/O pads to the bond sites may include wirebonding or directly electrically connecting the I/O pads to the bond sites to form a flip-chip type connection. A contact surface on an end of each of the posts may be directly electrically connected to a contact surface on an adjacent semiconductor device package.

In one embodiment, forming the plurality of posts includes: selecting a sheet of the electrically conductive material having a profile height equal to the predetermined profile height of the semiconductor device package; and selectively removing material from the sheet to form the posts. In another embodiment, forming the plurality of posts includes: selecting a sheet of the electrically conductive material having a profile height greater than the predetermined height of the semiconductor device package, and selectively removing material from the sheet to form the posts on a substrate portion of the electrically conductive material. In this embodiment, the method further comprises: removing the substrate portion of the electrically conductive material after covering the die and posts and post extensions with the molding compound.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

The invention will be more fully understood from the following detailed description taken in conjunction with the accompanying drawings wherein like elements are numbered alike, and in which:

FIGS. 5a-5j depict the semiconductor device package of FIG. 1 in various stages of assembly using a first method for assembling the semiconductor device;

FIGS. 6a-6j depict the semiconductor device package of FIG. 1 in various stages of assembly using a second method for assembling the semiconductor device;

FIGS. 12a-12h depict the semiconductor device package of FIG. 7 in various stages of assembly using a first method for assembling the semiconductor device;

FIGS. 13a-13h depict the semiconductor device package of FIG. 7 in various stages of assembly using a second method for assembling the semiconductor device;

FIG. 14 is a cross-sectional elevation view of a stack of semiconductor device packages having each semiconductor device package arranged with the die in an upright position;

FIG. 15 is a cross-sectional elevation view of a stack of semiconductor device packages having each semiconductor device package arranged with the die in an upside-down position; and FIG. 16 is a cross-sectional elevation view of a stack of semiconductor device packages having a semiconductor device packages arranged in alternating upright and upside-down positions.

DETAILED DESCRIPTION

Figure 1:
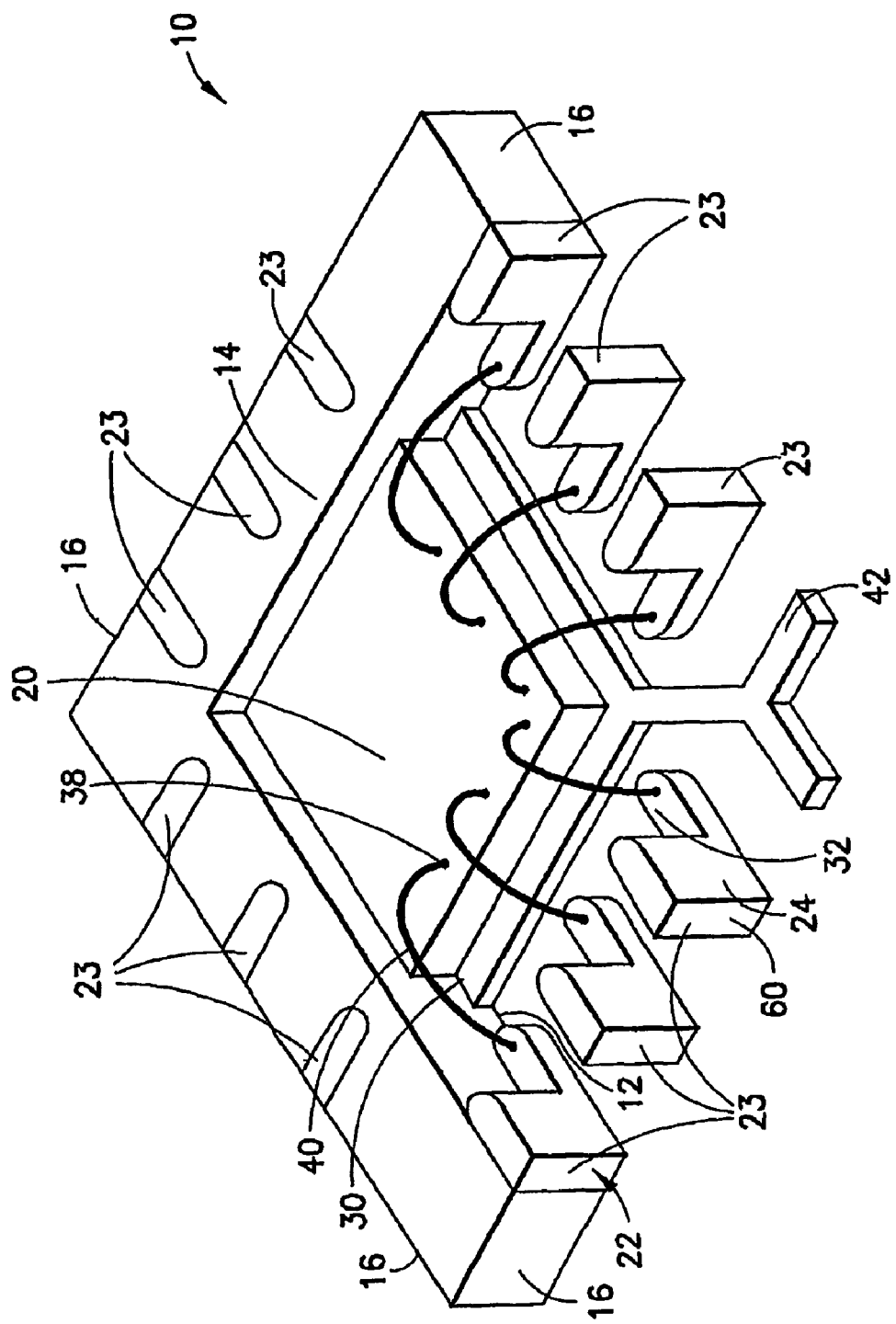
FIG. 1 is a partial cut-away, top perspective view of a quad, no-lead, wirebonded semiconductor device package in accordance with an embodiment of the present invention.
Figure 2:
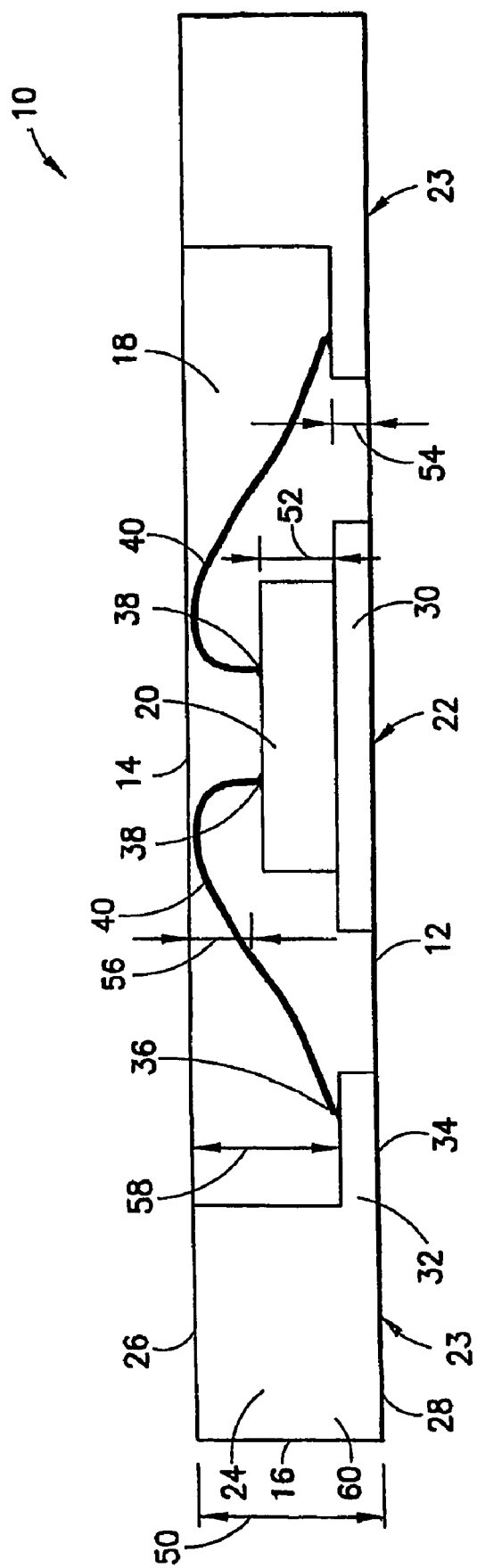
FIG. 2 is a cross-sectional elevation view of the semiconductor device package of FIG. 1.

Referring to FIGS. 1 and 2, a quad, no-lead, wirebonded semiconductor device package 10 is shown. The semiconductor device package 10 has a bottom package face 12, a top package face 14 opposite the bottom package face 12, and package side faces 16 extending between the bottom and top package faces 12, 14. The various package faces are formed in part by a molding compound 18, which covers a semiconductor device (die) 20 and portions of an electrically conductive lead frame 22. The electrically conductive lead frame 22 includes a plurality of leads 23. Each of the leads 23 includes a post 24 disposed at a perimeter of the package. Each of the posts 24 has a first contact surface 26 disposed at the top package face 14 and a second contact surface 28 disposed at the bottom package face 12. The die 20 is attached to a die support pad 30 positioned in a central region formed by the plurality of posts 24. Each lead 23 also includes a post extension 32, having a contact surface 34 disposed at the bottom package face 12. Each post extension 32 extends, from the associated post 24 toward the die 20, with the posts 24 and post extensions 32 forming a recess for receiving the die 20. Each post extension 32 includes a bond site 36 formed on a surface of the post extension 32 opposite the bottom package face 12. In the embodiment shown, the bond sites 36 are electrically connected to associated input/output I/O pads 38 on the die 20 via wires 40.

The leads 23 are spaced apart from each other and from the die pad 30 to electrically isolate the leads 23 from each other and from the die pad 30. Extending from each of the four corners of the die pad 30 is a tie bar 42, which is shown as a generally straight bar having protrusions extending from an end thereof. The tie bar 42 acts to anchor the die pad 30 within the molding compound 18.

In the embodiment shown, the lead frame 22 includes three leads 23 disposed on each of the four sides of the package 10. It will be appreciated, however, that the number and location of the leads 23 may be modified as needed for a particular application. For example, the lead frame 22 may include two sets of leads 23 disposed on opposing sides of the package 10 for use in a dual, no-lead, semiconductor package.

The package 10 provides a profile height, as indicated at 50 in FIG. 2, that is typically several times greater than the thickness of the enclosed die 20. For example, for a die profile height (indicated at 52) of about 0.2 millimeters (mm) the package profile height 50 may be about 0.5 mm, with the post extension 32, die support pad 30, and tie bars 42 having a profile height (indicated at 54) of about 0.1 mm. Accounting for a layer of bonding material between the die 20 and the die support pad 30 of about 0.025 mm, about 0.175 mm remains above the die 20 for receiving the bond wire (indicated at 56). The profile height of the posts is equal to the profile height 50 of the package (about 0.5 mm), with the profile height of the posts relative to the bond site (indicated at 58) being about 0.4 mm. In general, the package 10 may have a profile height 50 about 2.5 times greater than the profile height 52 of the die 20.

Figure 3:
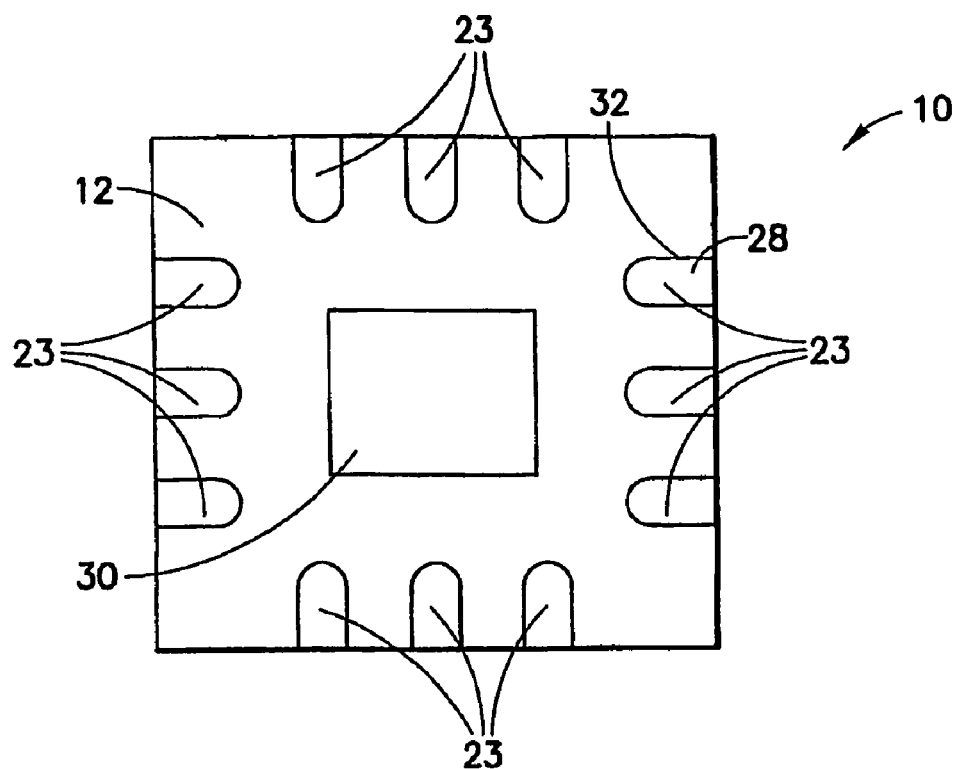
FIG. 3 is a bottom view of the semiconductor device package of FIG. 1.
Figure 4:
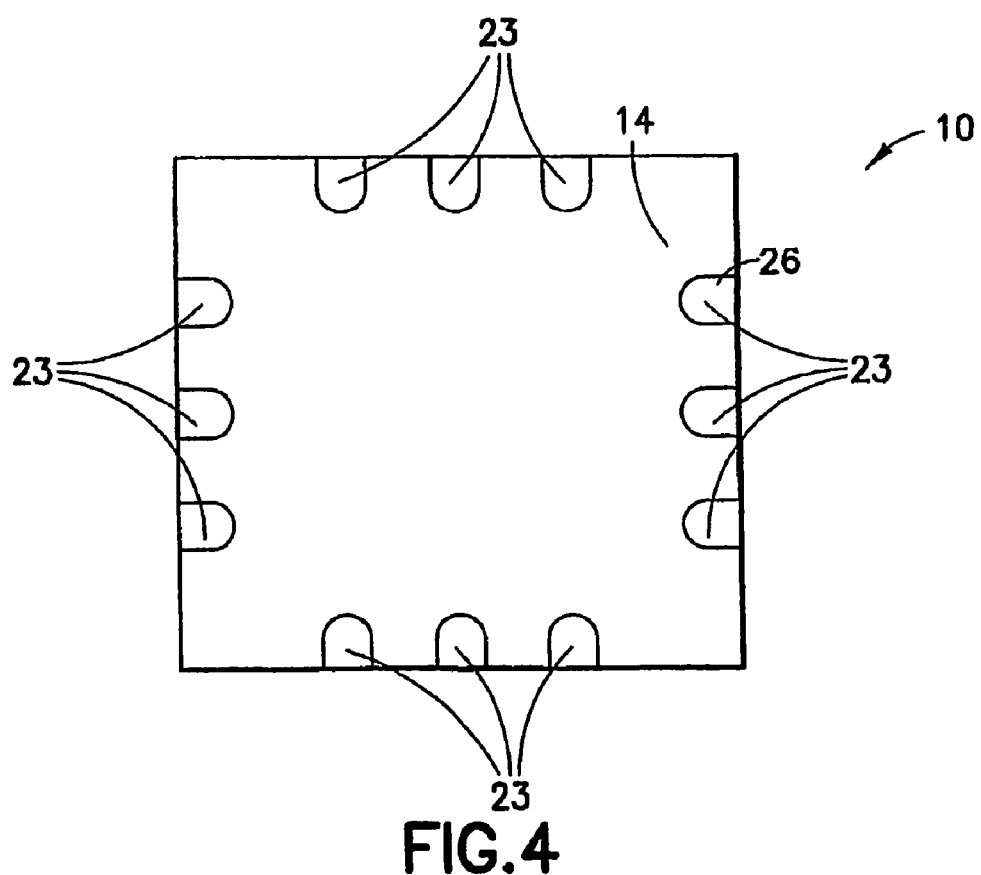
FIG. 4 is a top view of the semiconductor device package of FIG. 1.

As shown in FIG. 3, a portion of each lead 23 is exposed on the bottom face 12 of the package 10. The exposed portion of the leads 23 includes the contact surfaces 28 on each of the posts 24, and the contact surface 34 of the post extensions 32. As shown in FIG. 4, the contact surfaces 28 on each of the leads 23 are exposed at the top face 14 of the package 10. Comparison of FIGS. 3 and 4 shows that the total contact surface area on the bottom face 12, which includes both the contact surface 28 of each of the posts 24 and the contact surface 34 of the post extension 32, is greater than the contact surface 26 area at the top face 14. The package 10 may be electrically connected to an external circuit, such as a printed circuit board, another semiconductor device package, or test device, at any of the contact surfaces 26, 28 or 34 and/or at exposed side surfaces 60 (FIG. 2) of the posts 24. Electrical signals are transmitted between the die 20 and the external circuitry via each I/O pad 38, wire 40, post extension 32 and post 24.

The design of lead frame 22 allows the package 10 to be assembled using the same equipment used for standard QFN assembly and finishing. For example, the package 10 can be assembled using a lead frame having pre-formed leads, with or without taping, or it can employ the use of a partially etched lead frame, where a substrate is partially etched to define the leads 23 and the substrate is removed to form the leads after encapsulation. Each of these methods is discussed hereinafter.

Referring now to FIG. 5, the semiconductor device package 10 is shown in various stages of assembly using a method employing a lead frame 22 having pre-formed leads 23. FIG. 5a is a plan view of three interconnected lead frames 22, and FIGS. 5b-5j are cross-sectional elevation views of the interconnected lead frames 22 in various stages of assembly. As shown in FIG. 5, more than one lead frame 22 is preferably partially connected to allow for simultaneous assembly of packages 10. It is contemplated that, alternatively, the packages 10 may be assembled individually.

The lead frames 22 may be formed from a sheet of any suitable conductor and is preferably copper or a copper-base alloy. By copper-base alloy it is meant that the material contains more than 50%, by weight, of copper. The sheet of conductive material forming the lead frames 22 has a profile height equal to the desired profile height of the package 10.

The features of the lead frame 22, including the die support pad 30, the leads 23, and tie bars 42 may be formed using any known method such as stamping, chemical etching, laser ablation, or the like. The various recesses formed in each of these features are preferably formed using a controlled subtractive process such as chemical etching or laser ablation. For example, each surface intended to form the contact surfaces 26 of the posts 24 may be coated with a chemical resist and the remaining surface exposed to a suitable etchant for a time effective to reduce the thickness beneath the remaining surface to the desired thickness (i.e., profile height) of the post extensions 32, die support pad 30, and tie bars 42. The intended upper surfaces of these structures may then be coated with the chemical resist, and the remaining surface exposed to the etchant for a time effective to remove the material other than the leads 23, support pad 30, and tie bars 42.

Referring to FIG. 5c, after the lead frame 22 is formed, the bond sites 36 on the post extensions 32 may be plated with a material to facilitate bonding with the bond wire. For example, where a gold bond wire is used, the bond site 36 may be plated with gold. Alternatively, the entire lead frame 22 may be plated, or plating may not be performed, depending on the particular application or type of bond wire used.

Referring to FIG. 5d, in preparation for wirebonding, the bottom contact surface 28 of the posts 24, the contact surface 34 of the post extension 32, and the bottom surface of the die support pad 30 are secured to a surface 70. In the embodiment shown, the surface 70 is formed on an adhesive tape, which contacts and secures the substantially coplanar contact surfaces 28 and 34 and bottom surface of the die support pad 73.

Figure 5A:
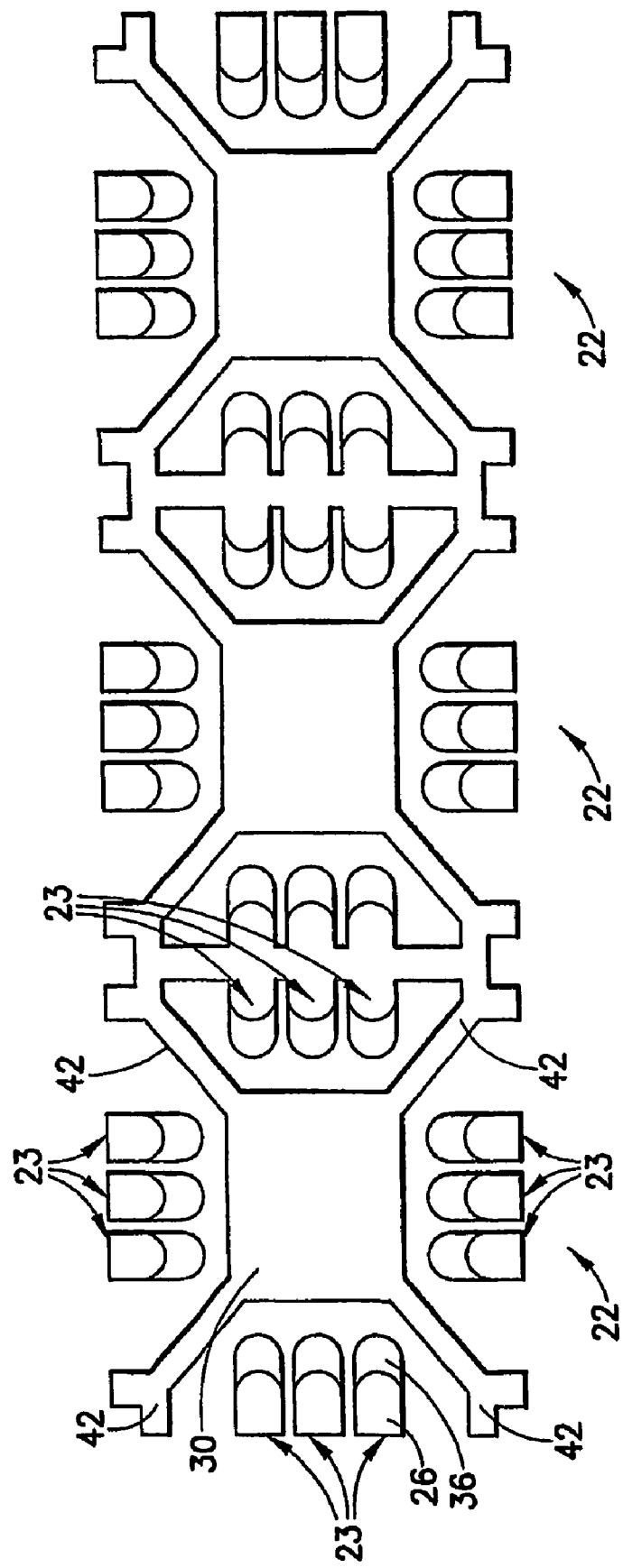
Figure 5E:
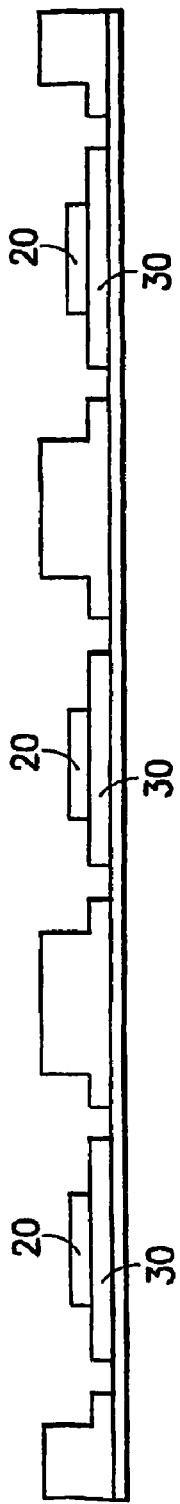
Figure 5F:
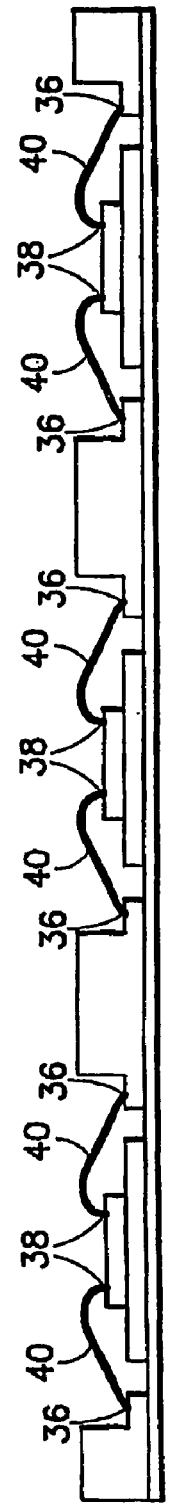

Referring to FIG. 5e, the die 20 is next secured to the support pad 30 using any convenient method, such as solder, epoxy, double-sided adhesive tape, and the like. After the die 20 is secured to the support pad 30, wires 40 are individually connected between I/O pads 38 on the die 20 and the bond sites 36 on the respective leads 23.

During assembly of the packages using the method of FIG. 5, the post extensions 32 are secured to the surface 70 with the die support pad 30, thus allowing precise bonding of the wires 40 to the bond sites 36 and, as a result, reducing defects in the assembly of the package 10. In addition, because the post extensions 32 are supported along their entire length by the surface 70, the present invention allows for a wider variety of bonding methods and wire materials to be used in wirebonding than were possible with leads of the prior art. For example, the wirebonding may be performed using ultrasonic bonding, where a combination of pressure and ultrasonic vibration bursts are applied to form a metallurgical cold weld, thermocompression bonding, where a combination of pressure and elevated temperature are applied to form a weld, or thermosonic bonding where a combination of pressure, elevated temperature, and ultrasonic vibration bursts are applied to form a weld. The type of wire 40 used in the bonding is preferably made from gold, gold based alloy, aluminum, or aluminum based alloy. As an alternative to wirebonding, tape automated bonding (TAB) may be used.

Figure 5G:
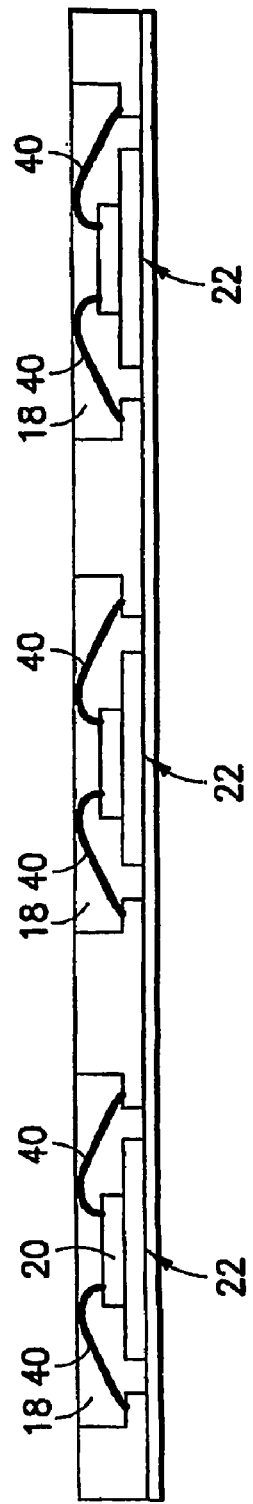

Referring to FIG. 5g, after the wire bonding is completed, the die 20, lead frame 22, and bond wires 40 are covered with the molding compound 18. The molding compound 18 may be applied using any convenient technique, such as a transfer or injection molding process. The molding compound is an electrically insulative material, preferably a polymer molding resin, such as an epoxy, having a flow temperature in the range of between about 150° C. to about 300° C. The molding compound 18 may also be a low temperature thermal glass composite. During application of the molding compound 18, the spacing between the leads 23 is maintained because the posts 24 and post extensions 32 are secured to the surface 70.

Figure 5H:
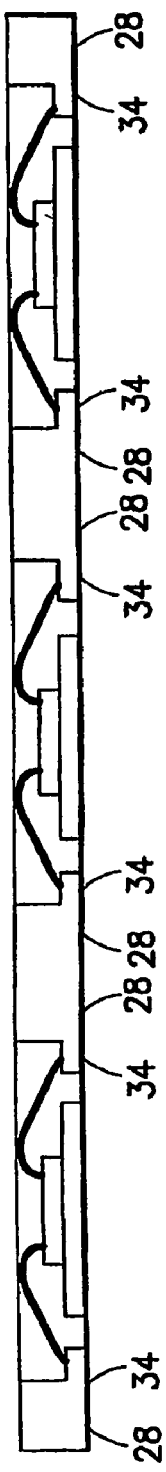

Referring to FIG. 5h, after coating, the interconnected packages 10 are separated from the surface 70 and the connecting surfaces 28 and 34 are plated with a material to facilitate electrical connection with the external electrical circuit. If the entire lead frame 22 was previously plated, plating of the connecting surfaces 28 and 34 may be unnecessary.

Figure 5I:
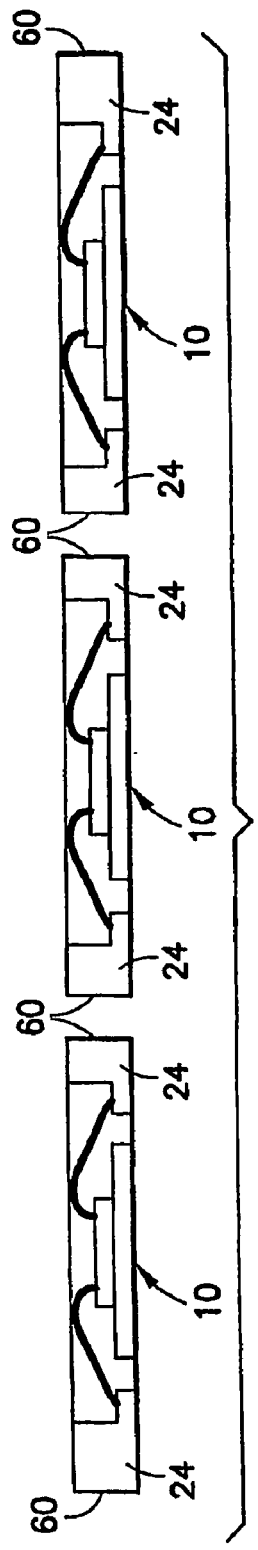

The attached packages 10 are then singulated by sawing with a blade, water jet, or the like, as shown in FIG. 5i. After singulation, the side surfaces 60 of all posts 24 are exposed.

Figure 5J:
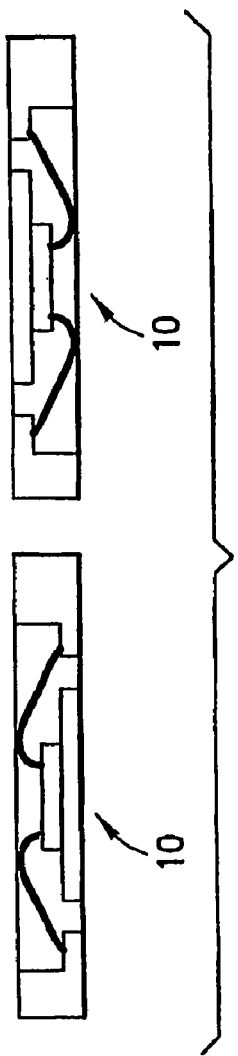

The package 10 can be electrically connected to a printed circuit board, another package, or any other external circuit using the contact surfaces 26, 28 and/or 34 on bottom face 12 and/or top face 14 as desired, thus making the package 10 completely reversible. That is, the package 10 may be mounted with the die 20 in the upright position, or the package 10 may be reversed and mounted with the die 20 upside-down, as shown in FIG. 5j. The reversibility of the package 10 relieves the need for any die 20 or package 10 redesign between applications requiring the die 10 to either face up or down. The contact surfaces 26, 28 and 34 on the top and bottom faces 14, 12 also allow a plurality of packages 10 to be stacked to provide increased chip density. In addition, any of the contact surfaces 26, 28 and 34 or the side surfaces 60 may be used as test points to test an electrical function of the package 10 or to test the electrical connection of the package 10 to an external circuit. The side surfaces 60 also act as a visible indicator to ensure proper alignment with pads on a printed circuit board when surface mounting the package 10 to a printed circuit board.

Referring now to FIG. 6, the semiconductor device package 10 is shown in various stages of assembly using a method employing a partially etched lead frame. FIG. 6a is a plan view of a precursor 72 of the lead frame 22, and FIG. 6b is a cross-sectional elevation view of the lead frame precursor 72. A plurality of lead frame precursors 72 are preferably connected to allow for simultaneous assembly. It is contemplated that, alternatively, the lead frame precursors 72 may be assembled individually.

The lead frame precursor 72 may be formed from a sheet of any suitable conductor and is preferably copper or a copper-base alloy. By copper-base alloy it is meant that the material contains more than 50%, by weight, of copper. The sheet of conductive material forming the lead frame precursor has a profile height greater than the desired profile height of the package 10.

The various features formed in each of lead frame precursors 72 are preferably formed using a controlled subtractive process such as chemical etching or laser ablation. For example, each surface intended to form the contact surfaces 26 of the posts 24 may be coated with a chemical resist and the remaining surface exposed to a suitable etchant for a time effective to reduce the thickness beneath the remaining surface such that the desired profile height of the posts 24 relative to the bond sites 36 is achieved. Next, the intended upper surfaces of the post extensions 32, die support pad 30, and tie bars (not shown) may then be coated with the chemical resist, and the remaining surface exposed to the etchant for a time effective to remove a sufficient amount of material to provide the desired profile heights of the posts 24, post extensions 32, support pad 30, and tie bars (not shown) relative to an upper surface 74 of the remaining material, which forms a substrate 76. This process results in partially formed posts 24, post extensions 32, tie bars, and support pad 30, all of which extend from the substrate 76.

Figure 6A:
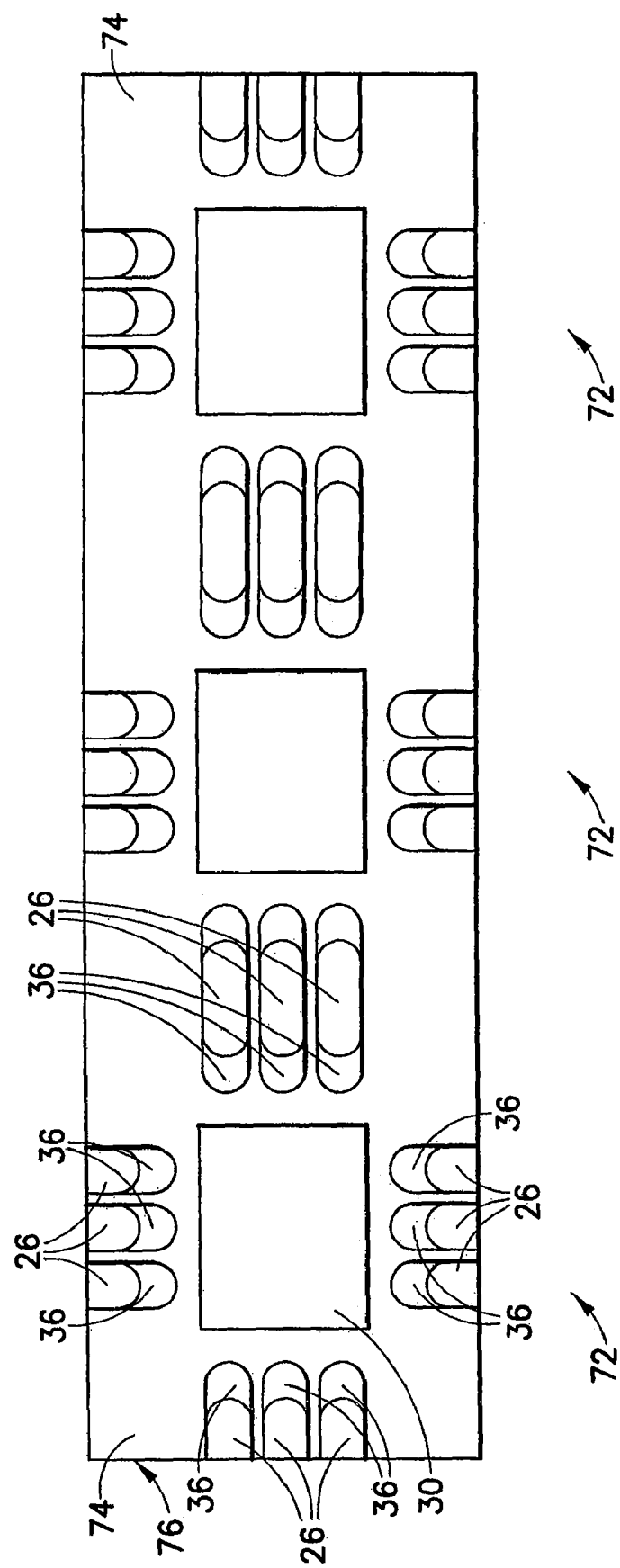
Figure 6B:
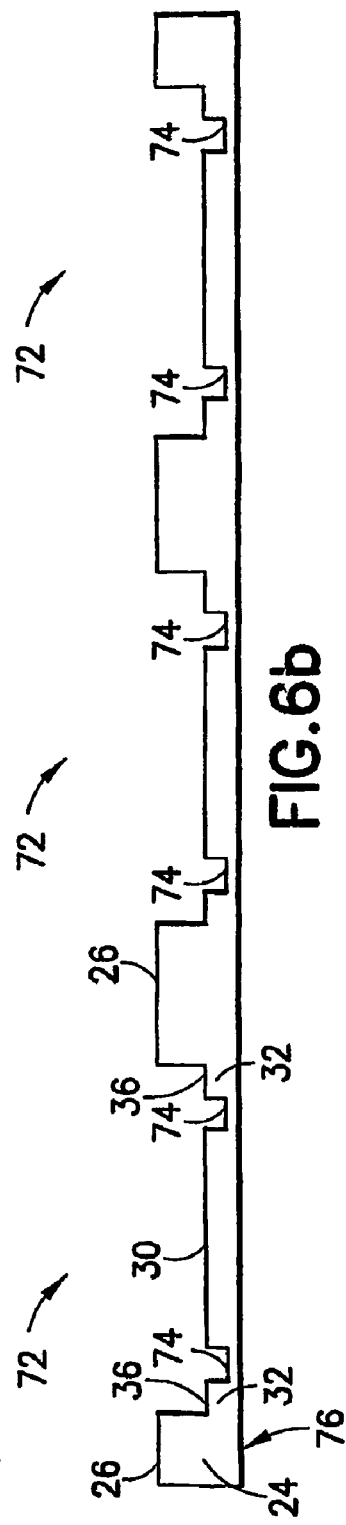
Figure 6C:
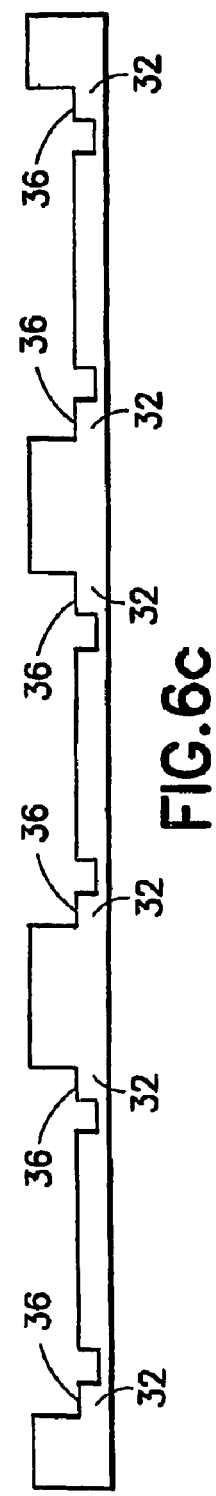

Referring to FIG. 6c, the bond sites 36 on the post extensions 32 may be plated with a material to facilitate wire bonding. For example, where a gold bond wire is used, the bond site may be plated with gold.

Figure 6D:
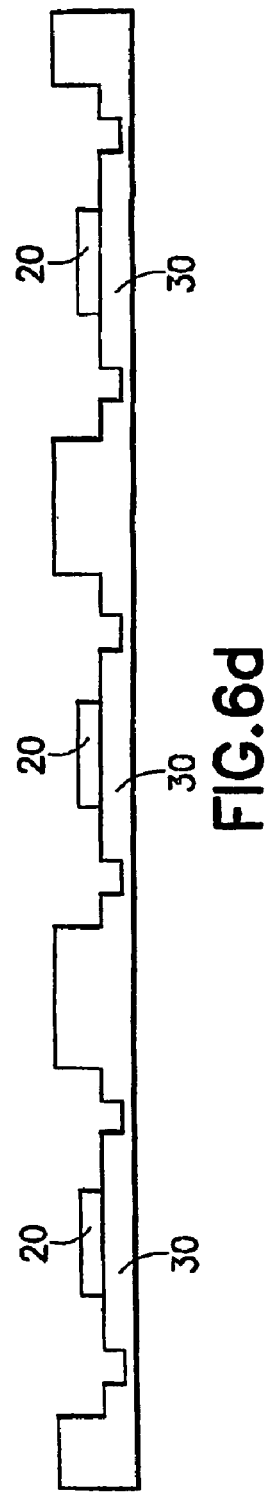

Referring to FIG. 6d, the die 20 is next secured to the support pad 30 using any convenient method, such as solder, epoxy, double-sided adhesive tape, and the like. After the die 20 is secured to the support pad 30, wires 40 are individually connected between I/O pads 38 on the die 20 and the bond sites 36 on the respective leads, as shown in FIG. 6e.

In the method of FIG. 6, the post extensions 32 extend from a common surface, the substrate 76, along with the die support pad 30, thus allowing precise bonding of the wires 40 to the bond sites 36. As a result, defects in the assembly of the package 10 are reduced. In addition, because the post extensions 32 are supported along their entire length by the substrate 76, a wider variety of bonding methods and wire materials may be used in wirebonding than were possible with designs of the prior art. For example, wire bonding may be performed using ultrasonic bonding, where a combination of pressure and ultrasonic vibration bursts are applied to form a metallurgical cold weld, thermocompression bonding, where a combination of pressure and elevated temperature are applied to form a weld, or thermosonic bonding where a combination of pressure, elevated temperature, and ultrasonic vibration bursts are applied to form a weld. The type of wire used in the bonding is preferably made from gold, gold based alloy, aluminum, or aluminum based alloy. As an alternative to wirebonding, tape automated bonding (TAB) may be used.

Referring to FIG. 6f, after the wire bonding is completed, the die 20, lead frame precursor 72, and bond wires 40 are covered with the molding compound 18. The molding compound 18 may be applied using any convenient technique, such as a transfer or injection molding process. The molding compound 18 is an electrically insulative material, preferably a polymer molding resin, such as an epoxy, having a flow temperature in the range of between about 150° C. to about 300° C. The molding compound 18 may also be a low temperature thermal glass composite.

Figure 6H:

After the encapsulation of the lead frame precursors 72 with the molding compound 18, the substrate material 76 is removed using a controlled subtractive process such as chemical etching or laser ablation. The result of this step is shown in FIG. 6g. Removal of the substrate material 76 creates the contact surfaces 28 and 34 and the bottom surface of the die pad 30 and tie bars (not shown). These surfaces may be plated to facilitate electrical connection to an external circuit. Also, solder balls 78 may be attached to the contact surfaces 28 and/or 34 to facilitate electrical connection with an external circuit, as shown in FIG. 6h.

Figure 6I:
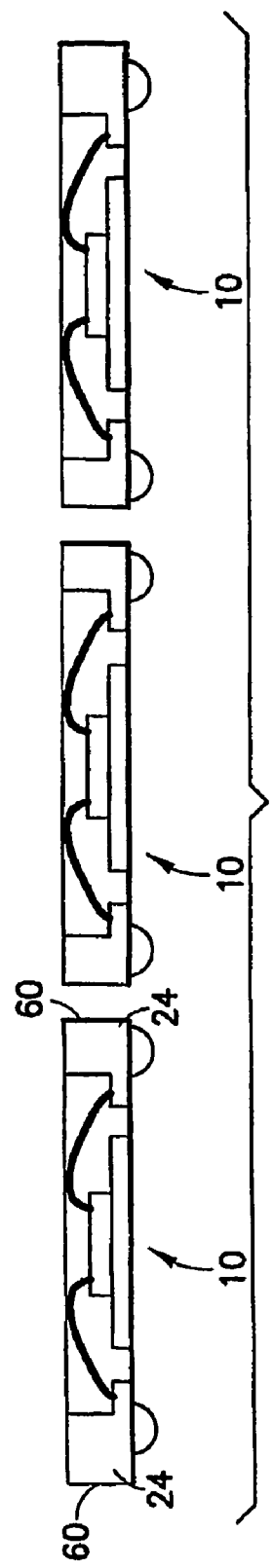
Figure 6J:
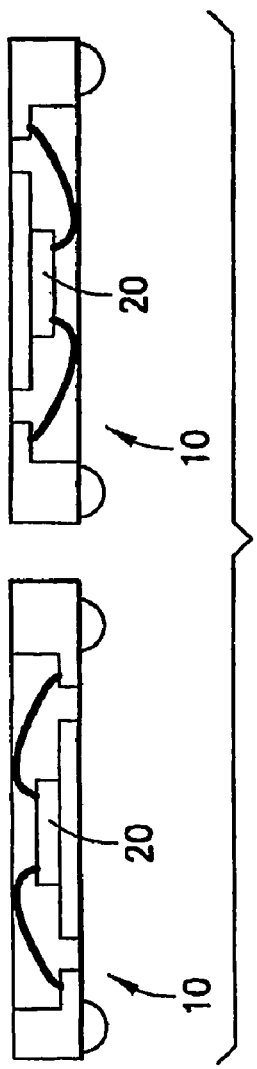

The attached packages 10 are then singulated by sawing with a blade, water jet, or the like, as shown in FIG. 6i. After singulation, the side surfaces 60 of all posts 24 are exposed. The resulting package 10 is the same as that resulting from the method described with reference to FIG. 5. The package may be mounted with the die 20 in the upright position, or the package may be reversed and mounted with the die 20 upside-down, as shown in FIG. 6j.

Figure 7:
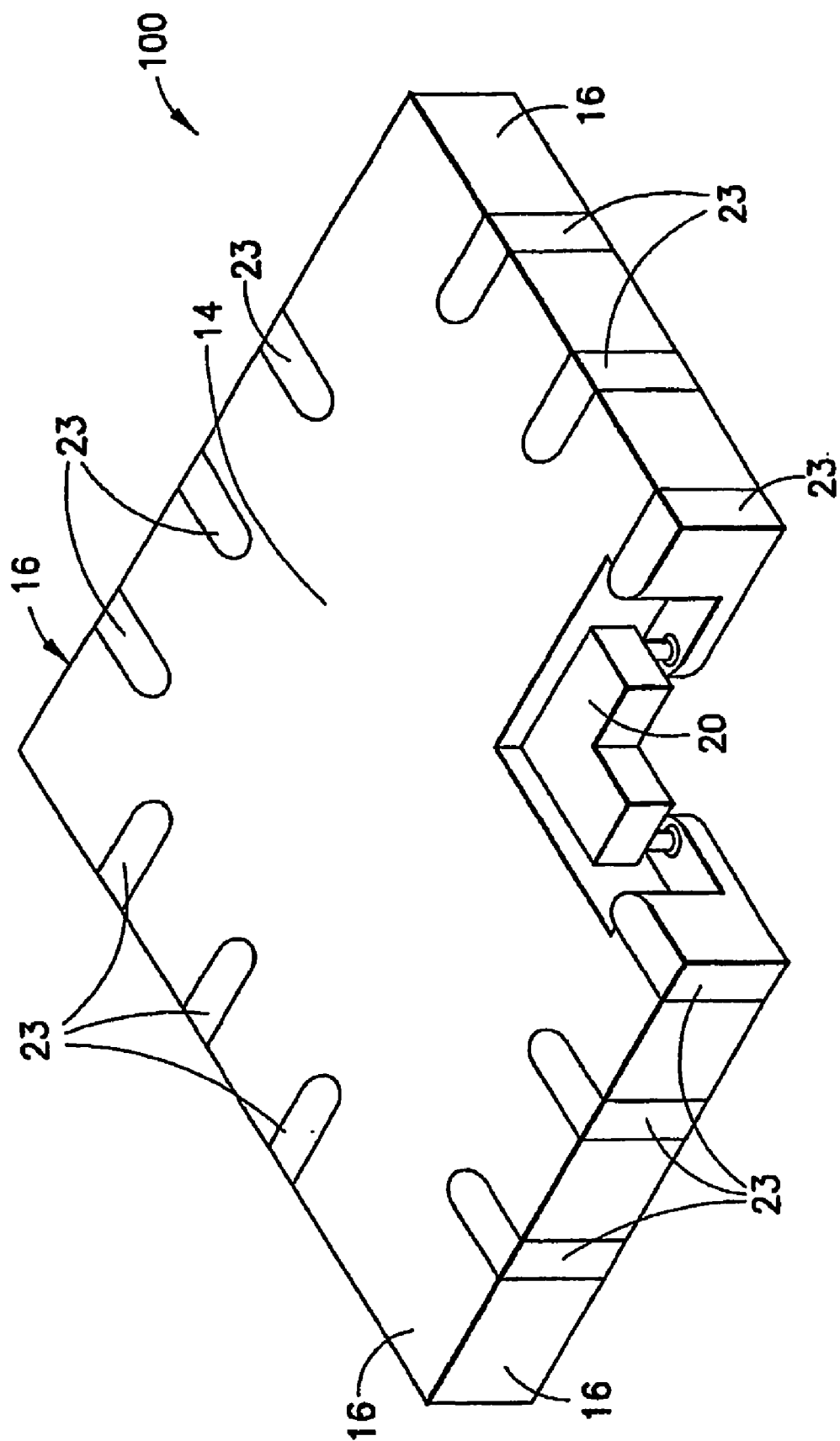
FIG. 7 is a partial cut-away, top perspective view of a quad, no-lead, flip-chip semiconductor device package in accordance with another embodiment of the present invention.
Figure 8:
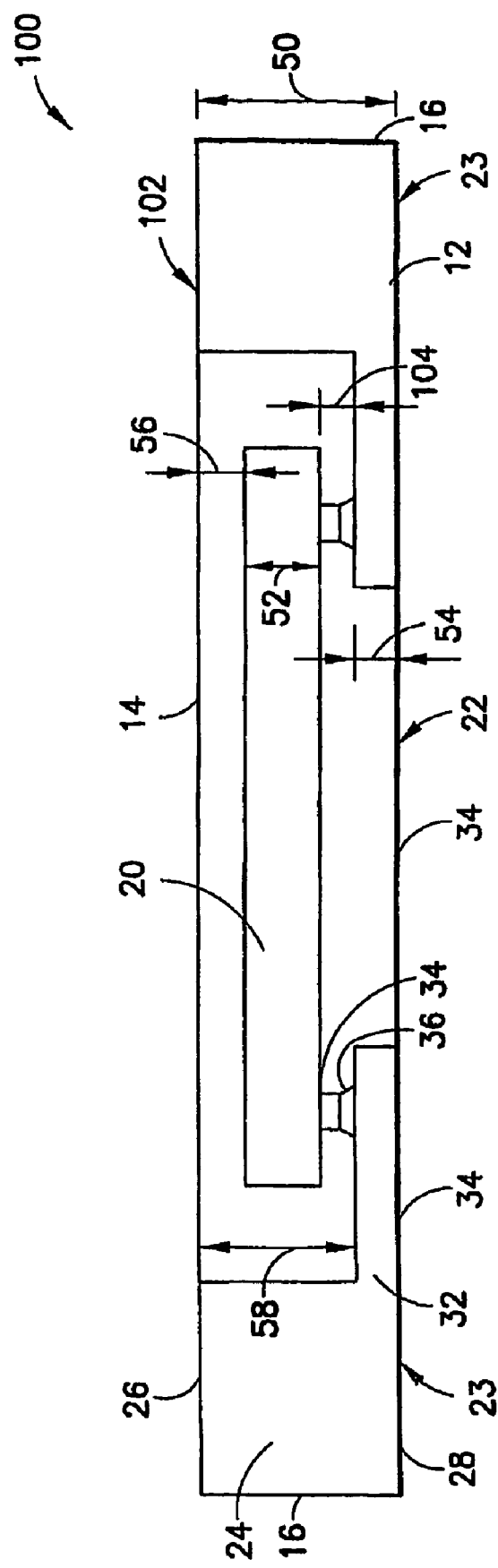
FIG. 8 is a cross-sectional elevation view of the semiconductor device package of FIG. 7.

Referring to FIGS. 7 and 8, a quad, no-lead, flip-chip semiconductor device package 100 is shown. The package 100 of FIG. 7 is substantially similar to the package 10 shown in FIGS. 1 and 2, except that the die 20 in package 100 is connected to a lead frame 102 using a flip-chip method and, as a result, no die support pad 30 or tie bars 42 are used. It is contemplated that the lead frame 22 of FIGS. 1 and 2 may be used for both flip-chip and wirebonded packages 10 and 100, with the lead frame 22 being modified to lead frame 102 for the flip-chip package 100 by removing the die support pad 30 and the bars 42.

The package 100 provides a profile height, as indicated at 50 in FIG. 8, that is typically several times greater than the thickness of the enclosed die 20. For example, for a die profile height 52 of about 0.2 millimeters (mm) the package profile height 50 may be about 0.5 mm, with the post extension 32 having a profile height 54 of about 0.1 mm. Accounting for a bond height 104 between the die 20 and the bond site 36 of about 0.075 mm after reflow, about 0.125 mm remains above the die 20, as indicated at 56. The profile height of the posts 24 is equal to the profile height 50 of the package 100 (about 0.5 mm), with the profile height 58 of the posts 24 relative to the bond site 36 being about 0.4 mm. In general, the package 100 may have a profile height 50 about 2.5 times greater than the profile height 52 of the die.

Figure 9:
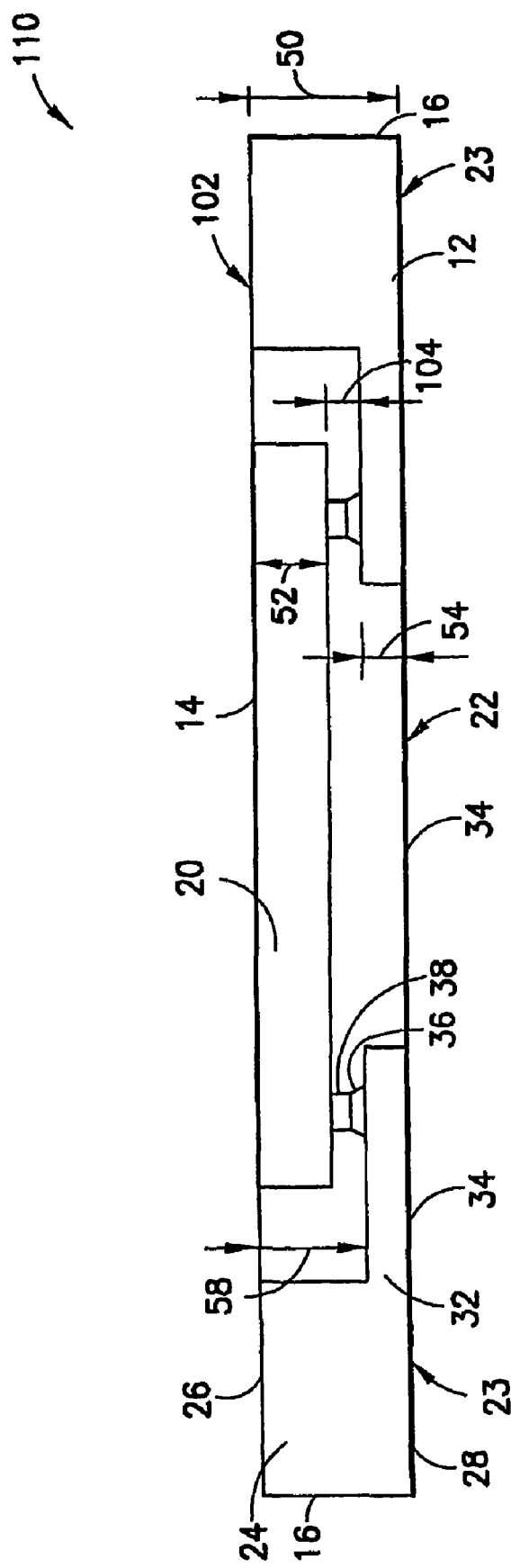
FIG. 9 is a cross-sectional elevation view of an alternative arrangement of the semiconductor device package of FIG. 7.

FIG. 9 shows another embodiment of a quad, no-lead, flip-chip semiconductor device package, indicated at 110. Package 110 is the same as package 100 (FIG. 8), except one side of the die 20 is exposed on the top package face 14 in package 110. Exposing the die 20 on the top package face 14 may be beneficial for controlling heat in the die 20 and allows for a thinner profile height 50. For example, for a die 20 profile height 56 of about 0.2 millimeters (mm) the package 110 profile height 50 may be about 0.4 mm, with the post extension 32 having a profile height 54 of about 0.1 mm. The package 110 profile height 50 of 0.4 mm accounts for a bond height 104 between the die 20 and the bond site 36 of about 0.075 mm after reflow. The profile height of the posts 24 is equal to the profile height 50 of the package 110 (about 0.4 mm), with the profile height 58 of the posts 24 relative to the bond site 36 being about 0.3 mm. In general, the package 110 may have a profile height 50 about 2 times greater than the profile height 56 of the die 20.

Figure 10:
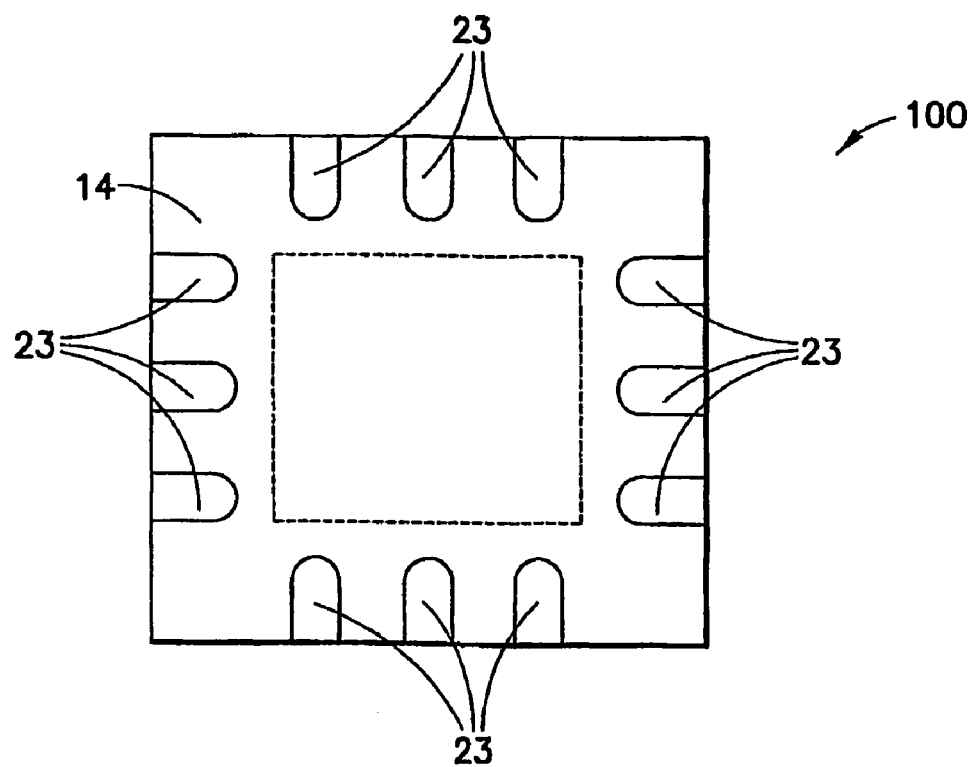
FIG. 10 is a top view of the semiconductor device package of FIG. 7.
Figure 11:
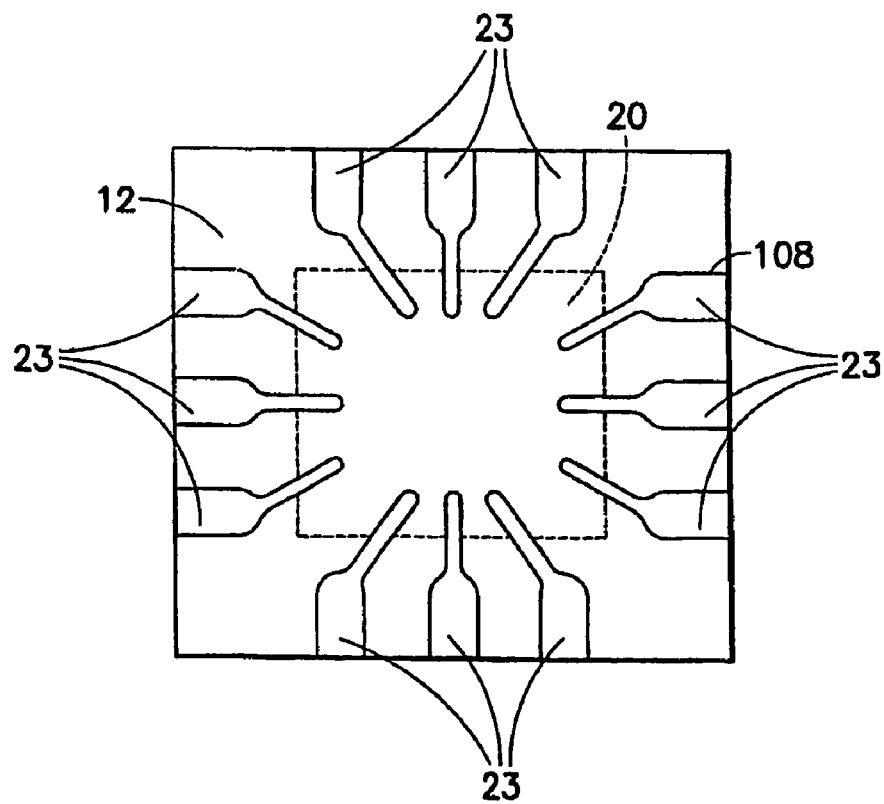
FIG. 11 is a bottom view of the semiconductor device package of FIG. 7 showing optional lead traces.

FIGS. 10 and 11 show top and bottom views of the package 100, respectively. As shown in FIG. 10, the contact surfaces 28 on each of the leads 23 are exposed at the top face 14 of the package 10. As shown in FIG. 11, a portion of each lead 23 is exposed on the bottom face 12 of the package 10. The exposed portions of the leads 23 include the contact surfaces 28 on each of the posts 24, and the contact surfaces 34 of the post extensions 32. Optionally, each of the post extensions 32 may be shaped to include interposers 108 extending between post extensions 32 and the die 20 for use with dies having a fine pitch between the die pads 38.

The methods for manufacturing the packages 100 and 110 of FIGS. 8 and 9 are similar to those described with reference to FIGS. 5 and 6, with the main exception being that the die 20 is directly electrically connected to the bond sites 36, as shown in FIGS. 8 and 9, rather than being attached to a support pad and wirebonded or tape bonded to the bond sites 36 as shown in FIGS. 5 and 6. By "directly" electrically connected it is meant that the interconnection is without the use of an intervening wire bond or tape automated bonding tape. Suitable attachments include solders with a primary constituent selected from the group consisting of gold, tin, and lead.

Referring now to FIG. 12, the semiconductor device package 100 is shown in various stages of assembly using a method employing a lead frame 102 having pre-formed leads 23. While package 100 of FIG. 8 is shown, the method described with reference to FIG. 12 is equally applicable to package 110 of FIG. 9. FIG. 12a is a plan view of the lead frame 102, and FIG. 12b is a cross-sectional elevation view of the lead frame 102. As shown in FIG. 12, more than one lead frame 102 may be partially interconnected to allow for simultaneous assembly. It is contemplated that, alternatively, the lead frames 102 may be assembled individually. The lead frames 102 may be formed using the method described with reference to FIG. 5 above, without forming a die support pad or the tie bars.

Figure 12A:
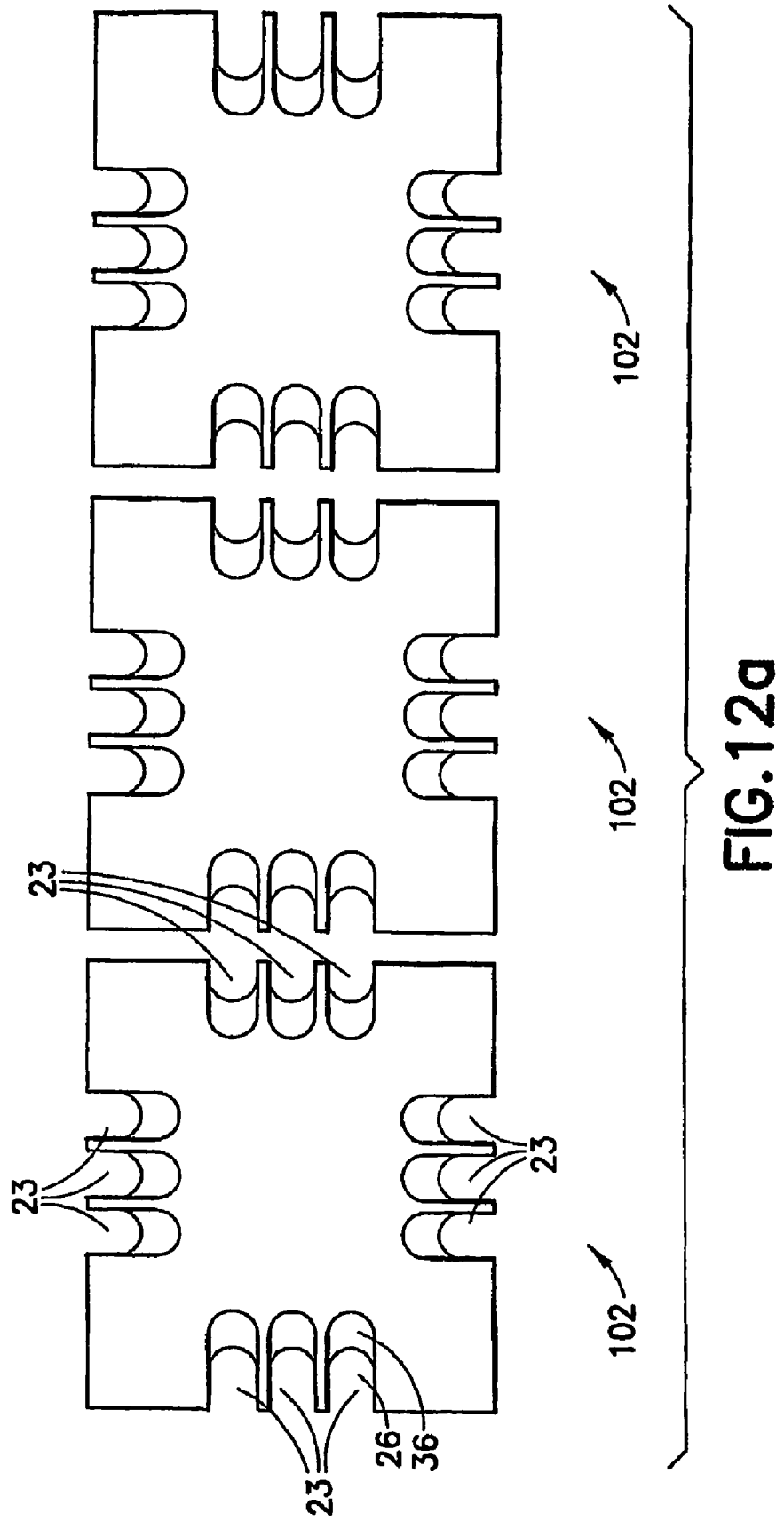
Figure 12B:
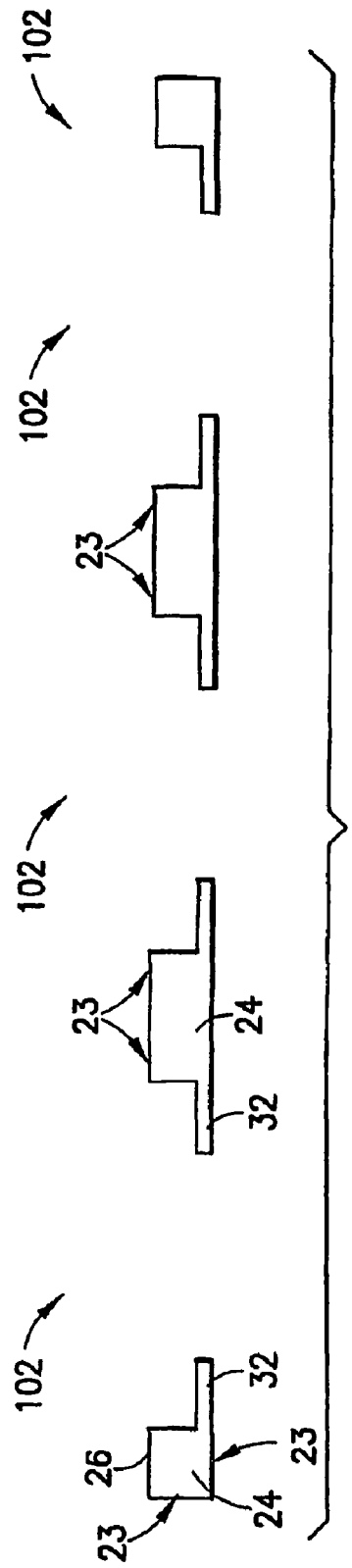
Figure 12C:

Referring to FIG. 12c, in preparation for bonding the die 20 to the leads 23, the second contact surface 28 of the posts 24 and the contact surface 34 of the post extension 32 may be secured to a surface 70. In the embodiment shown, the surface 70 is formed on an adhesive tape, which contacts and secures the substantially coplanar contact surfaces 28 and 32.

Figure 12D:
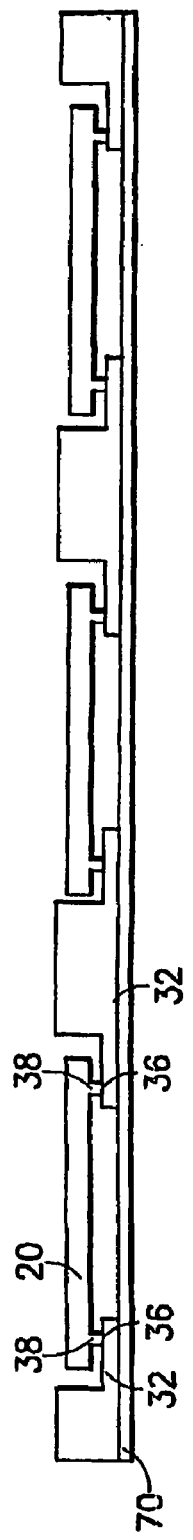

Referring to FIG. 12d, the I/O pads 38 on the die 20 are directly electrically connected to the bond sites 36 using any convenient method. The post extensions 32 are supported along their entire length by the surface 70, ensuring coplanarity of the bond sites 36. Because the coplanarity of the bond sites 36 is assured, accuracy of the flip-chip bond is increased and, therefore, the chance of manufacturing defects is decreased.

After the I/O pads 38 have been electrically connected to their associated bond sites 36, the die 20 and lead frame 102 are covered with the molding compound 18, as depicted in FIG. 12e. The molding compound 18 may be applied using any convenient technique, such as a transfer or injection molding process. The molding compound 18 is an electrically insulative material, preferably a polymer molding resin, such as an epoxy, having a flow temperature in the range of between about 150° C. to about 300° C. The molding compound 18 may also be a low temperature thermal glass composite. During application of the molding compound 18, the spacing between the leads 23 is maintained because they are secured to the surface 70. After the die 20 and lead frame 102 are coated, the interconnected packages 100 are separated from the surface 70 (e.g., the tape is removed).

Referring to FIG. 12f, the connecting surfaces 28 and 34 may be plated with a material to facilitate electrical connection with the external electrical circuit. If the entire lead frame 102 was previously plated, plating of the connecting surfaces 28 and 34 may be unnecessary.

The attached packages 100 are then singulated by sawing with a blade, water jet, or the like, as shown in FIG. 12g. After singulation, the side surfaces 60 of each post 24 are exposed.

Contact surfaces 26, 28 and 34 allow the package 100 to be electrically connected to a printed circuit board, another package, or any other external circuit using the contacts on the top surface 14 or bottom surface 12 as desired, thus making the package 100 completely reversible. That is, the package 100 may be mounted with the die 100 in the upright position, or the package 100 may be reversed and mounted with the die 100 upside-down, as shown in FIG. 12h. This relieves the need for any die 20 or package 100 redesign between applications requiring the die 20 to either face up or down. The contact pads 26, 28 and 34 on the top and bottom surfaces 14, 12 also allow a plurality of packages 100 to be stacked to provide increased chip density. The side surfaces 60 of the posts 24 may be used as test points to test an electrical function of the package 100 or to test the electrical connection of the package 100 to an external circuit. The side surfaces 60 also act as a visible indicator to ensure proper alignment with pads on a printed circuit board when surface mounting the package 100 to a printed circuit board.

Referring now to FIG. 13, the semiconductor device package 100 is shown in various stages of assembly using a method employing a partially etched lead frame. While package 100 of FIG. 8 is shown, the method described with reference to FIG. 12 is equally applicable to package 110 of FIG. 9. FIG. 13a is a plan view of a precursor 114 of the lead frame 102, and FIG. 13b is a cross-sectional elevation view of the lead frame precursor 114. A plurality of lead frame precursors 114 are preferably partially connected to allow for simultaneous assembly. It is contemplated that, alternatively, the lead frame precursors 114 may be assembled individually. The lead frame precursors 114 may be formed using the method described with reference to FIG. 6 above, without forming a die support pad or the tie bars.

Referring to FIG. 13c, the I/O pads 38 on the die 20 are directly electrically connected to the bond sites 36 using any convenient method. The post extensions 24 are supported along their entire length by the substrate material 76, thereby ensuring coplanarity of the bond sites 36. Because the coplanarity of the bond sites 36 is assured, accuracy of the flip-chip bond is increased and, therefore, the chance of manufacturing defects is decreased.

After the I/O pads 38 have been electrically connected to their associated bond sites 36, the die 20 and lead frame precursor 114 are covered with the molding compound 18, as depicted in FIG. 13d. The molding compound 18 may be applied using any convenient technique, such as a transfer or injection molding process. The molding compound 18 is an electrically insulative material, preferably a polymer molding resin, such as an epoxy, having a flow temperature in the range of between about 150° C. to about 300° C. The molding compound 18 may also be a low temperature thermal glass composite.

Figure 13A:
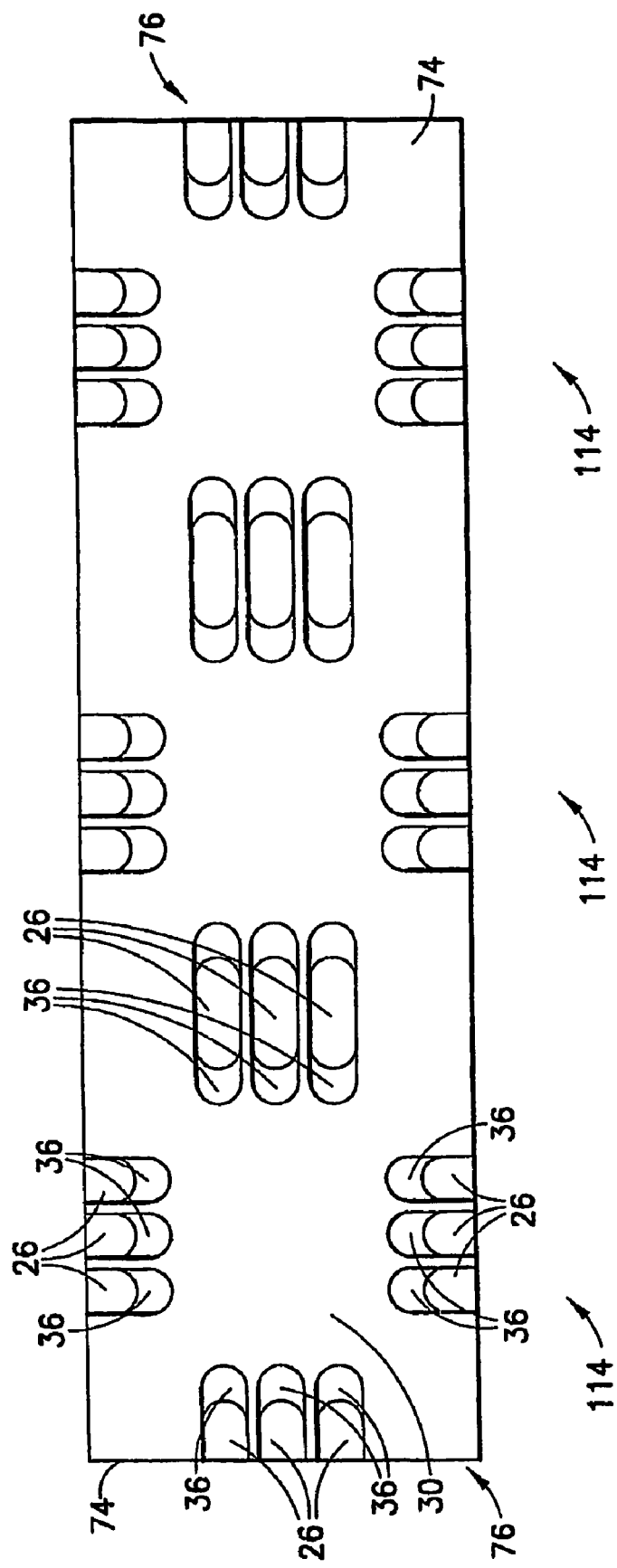
Figure 13E:
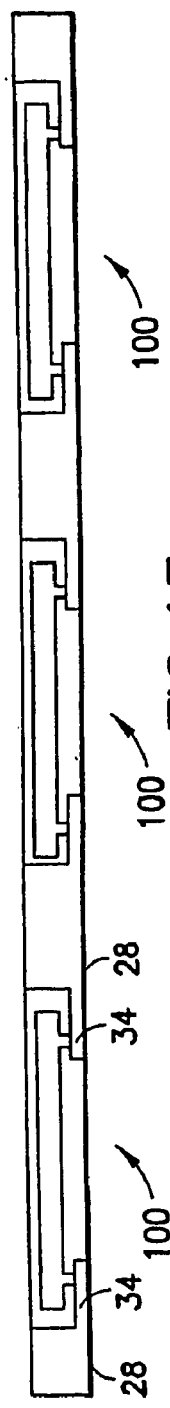
Figure 13F:
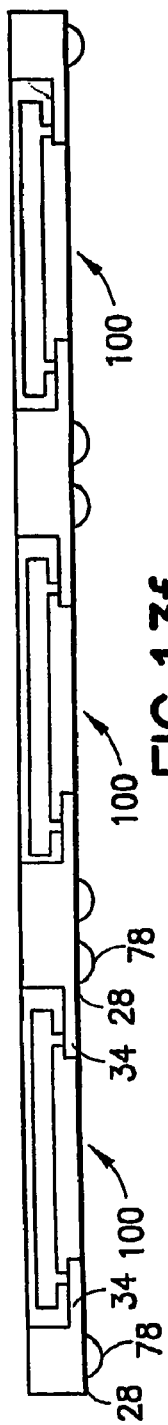

After covering the die 20 and lead frame precursors 114 with the molding compound 18, the substrate material 76 is removed using a controlled subtractive process such as chemical etching or laser ablation. Removal of the substrate material 76 creates the contact surfaces 28 and 34 as depicted in FIG. 13(*e*). These surfaces may be plated to facilitate electrical connection to an external circuit. Also, solder balls 78 may be attached to the contact surfaces 28 and or 34 to facilitate electrical connection, as shown in FIG. 13*f*.

Figure 13G:
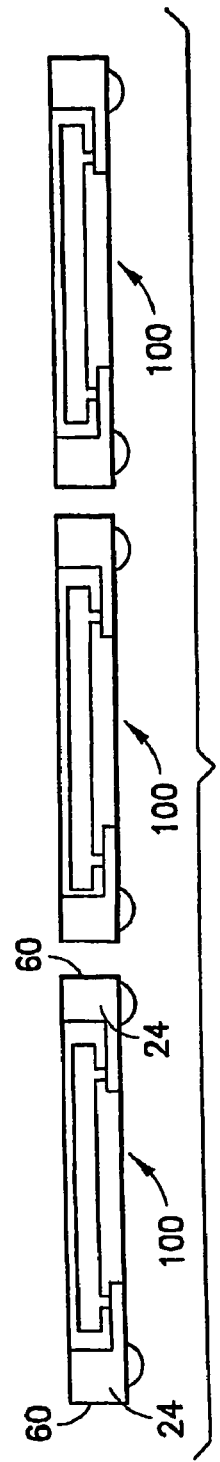

The attached packages 100 are then singulated by sawing with a blade, water jet, or the like, as shown in FIG. 13*g*. After singulation, the side surfaces 60 of each post 24 are exposed.

Figure 13H:
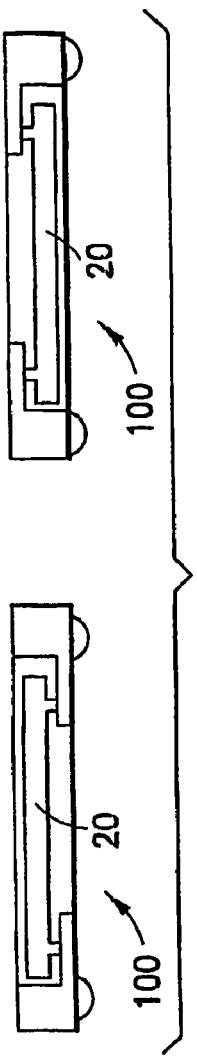

The resulting package 100 is the same as that resulting from the method described with reference to FIG. 9. The package 100 may be mounted with the die 20 in the upright position, or the package may be reversed and mounted with the die upside-down, as shown in FIG. 13*h*.

In the embodiments of FIGS. 1-10, the availability of contact surfaces 26, 28 and 34 on both the top and bottom faces 14, 12 allow a plurality of packages to be stacked to provide increased chip density. As shown in FIG. 14, the contact surfaces 26, 28, and/or 34 on each package 100 may be directly electrically connected the corresponding contact surfaces 26, 28, and/or 34 on an adjacent package 100 to form the stack. Suitable attachments include solders with a primary constituent selected from the group consisting of gold, tin, and lead. Because the packages 100 are directly electrically connected, the length of the electrical path between the dies 20 is kept to a minimum. The packages 100 may be arranged with the die upright 20, as shown in FIG. 14, or with the die 20 upside-down, as shown in FIG. 15. Alternatively, as shown in FIG. 16, the contact surfaces 26 or 28 on one package 100 may be directly electrically connected to the same contact surfaces 26 or 28 on an adjacent package 100, such that the packages are stacked in alternating top-to-top and bottom-to-bottom fashion. While package 100 is shown in FIGS. 14-16 for purposes of example, any of the embodiments described herein may be stacked in the same way.

Compared to conventional methods of increasing chip density, which employ stacked dies in a common package to reduce the profile of the stack, the stack of packages described herein reduces complexity in the assembly of the stack while providing similar chip densities. The reduction in complexity is due at least in part to the elimination of an insulative layer/interposer, which is used when dies are stacked in a common package. Furthermore, the package of the present invention provide the ability to test from top surface 14, bottom surface 12, or side surfaces 16. This presents a significant advantage in being able to identify which package in the stack is faulty. If any of the packages are found to be defective, the individual package and its chip can be discarded, thus reducing the waste associated with prior art packages that require the disposal of multiple chips in a common package. Finally, as a result of the leads having the same profile height as the package and forming part of the package side faces, the package of the present invention provides for increased thermal dissipation over that possible with the prior art arrangement.

The present invention provides for a reduced profile package that may be used alone or may be stacked where an increase in chip density is required. The package can be electrically connected to a printed circuit board, another package, or any other external circuit using the any of the contact surfaces on the bottom face and/or the top face of the package, thus making the package completely reversible. That is, the package may be mounted with the die in the upright position, or the package may be reversed and mounted with the die upside-down. The reversibility of the package relieves the need for any die or package redesign between applications requiring the die to either face up or down.

The package of the present invention may be assembled using the same equipment used for standard QFN assembly and finishing, and can be assembled using a lead frame having pre-formed leads, or using a partially etched lead frame. The package can be assembled using wirebonding, tape automated bonding, or flip-chip methods, with the lead frame being only slightly modified between each of these different methods.

A number of embodiments of the present invention have been described. Nevertheless, it will be understood that various modifications may be made without departing from the spirit and scope of the invention. Accordingly, other embodiments are within the scope of the following claims.

What is claimed is:

1. A semiconductor device package (10, 100) comprising:
 a molding compound (18) forming a portion of:
  a first package face (14),
  a second package face (12) opposite the first package face (14), and
  package side faces (16) extending between the first and second package faces (14, 12);
 a semiconductor device (20) at least partially covered by the molding compound (18), the semiconductor device (20) including a plurality of I/O pads (38); and
 an electrically conductive lead frame (22) comprising:
  a plurality of posts (24) disposed at a perimeter of the package (10, 100), each post (24) having a first contact surface (26) disposed at the first package face (14) and a second contact surface (28) disposed at the second package face (12) and having an edge surface extended entirely from the first package face to the second package face the semiconductor device (20) being positioned in a central region defined by the plurality of posts (24), and
  a plurality of post extensions (32), each post extension (32) having a third contact surface (34) disposed at the second package face (12), the plurality of post extensions (32) extending from the plurality of posts (24) toward the semiconductor device (20), each of the post extensions (32) including a bond site (36) formed on a surface of the post extension (32) opposite the second package face (12), at least one of the I/O pads (38) being electrically connected to the post extension (32) at the bond site (36),
 wherein
  the molding compound (18) is coplanar with side surfaces (60) of the posts (24) at the package side faces (16), and
  two package side faces (16) meet to form a square corner at each of four corner regions of the package (10, 100).

2. The semiconductor device package (10) of claim 1, wherein the at least one of the I/O pads (38) is wire bonded or tape bonded to the bond site (36).

3. The semiconductor device package (10) of claim 2, wherein the die (20) is attached to a support pad (30), the support pad (30) including a surface extending along the second package face (12).

4. The semiconductor device package (10, 100) of claim 1, wherein the semiconductor device package (10, 100) has four package side faces (16), and the plurality of posts (24) are disposed among two of the four package side faces (16).

5. The semiconductor device package (10, 100) of claim 1, wherein the semiconductor device package (10, 100) has four package side faces (16), and the plurality of posts (24) are disposed among all of the four package side faces (16).

6. The semiconductor device package (100) of claim 1, wherein the at least one of the I/O pads (38) is directly electrically connected to the bond site (36) for forming a flip-chip type connection.

7. A stack of semiconductor device packages (10, 100), each semiconductor device package (10, 100) comprising:
   a molding compound (18) forming a portion of:
      a first package face (14),
      a second package face (12) opposite the first package face (14), and
      package side faces (16) extending between the first and second package faces (14, 12);
   a semiconductor device (20) at least partially covered by the molding compound (18), the semiconductor device (20) including a plurality of I/O pads (38);
   an electrically conductive lead frame (22) comprising:
      a plurality of posts (24) disposed at a perimeter of the package (10, 100), each post (24) having a first contact surface (26) disposed at the first package face (14) and a second contact surface (28) disposed at the second package face (12) and having an edge surface extended entirely from the first package face to the second package face, the semiconductor device (20) being positioned in a central region defined by the plurality of posts (24), and
      a plurality of post extensions (32), each post extension (32) having a third contact surface (34) disposed at the second package face (12), the plurality of post extensions (32) extending from the plurality of posts (24) toward the semiconductor device (20), each of the post extensions (32) including a bond site (36) formed on a surface of the post extension (32) opposite the second package face (12), at least one of the I/O pads (38) being electrically connected to the post extension (32) at the bond site (36);
   wherein the first contact surfaces (26) of at least one of the semiconductor packages (10, 100) is directly electrically connected to one of the first and second contact surfaces (26, 28) of an adjacent semiconductor package (10, 100).

8. The stack of semiconductor device packages (10) of claim 7, wherein the at least one of the I/O pads (38) is wire bonded or tape bonded to the bond site (36).

9. The stack of semiconductor device packages (10) of claim 8, wherein the semiconductor device (20) is attached to a support pad (30), the support pad (30) including a surface extending along the second package face (12).

10. The stack of semiconductor device packages (100) of claim 7, wherein the at least one of the I/O pads (38) is directly electrically connected to the bond site (36) for forming a flip-chip type connection.

11. The stack of semiconductor device packages (10, 100) of claim 7, wherein each semiconductor device package (10, 100) has four package side faces (16), and the plurality of posts (24) are disposed among two of the four package side faces (16).

12. The stack of semiconductor device packages (10, 100) of claim 7, wherein each semiconductor device package (10, 100) has four package side faces (16), and the plurality of posts (24) are disposed among all of the four package side faces (16).

* * * * *